US010558781B2

(12) United States Patent
Sato

(10) Patent No.: US 10,558,781 B2
(45) Date of Patent: Feb. 11, 2020

(54) SUPPORT APPARATUS, DESIGN SUPPORT METHOD, AND DESIGN SUPPORT PROGRAM

(71) Applicant: FUJITSU LIMITED, Kawasaki-shi, Kanagawa (JP)

(72) Inventor: Kei Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 104 days.

(21) Appl. No.: 15/846,277

(22) Filed: Dec. 19, 2017

(65) Prior Publication Data
US 2018/0189440 A1 Jul. 5, 2018

(30) Foreign Application Priority Data
Jan. 5, 2017 (JP) ................................. 2017-000359

(51) Int. Cl.
*G06F 17/50* (2006.01)

(52) U.S. Cl.
CPC ...... *G06F 17/5081* (2013.01); *G06F 17/5068* (2013.01); *G06F 17/5072* (2013.01); *G06F 17/5077* (2013.01)

(58) Field of Classification Search
CPC ............... G06F 17/5068; G06F 7/5072; G06F 17/5077; G06F 17/5081
See application file for complete search history.

(56) References Cited

U.S. PATENT DOCUMENTS

| 6,567,964 B2* | 5/2003 | Shin ................. H01L 21/76819 257/E21.58 |
| 6,574,789 B1* | 6/2003 | Yamauchi ........... H01J 37/3026 716/55 |
| 6,615,399 B2* | 9/2003 | Yamauchi ........... G06F 17/5077 257/207 |
| 6,690,045 B2* | 2/2004 | Shinkawata ...... H01L 21/31053 257/258 |
| 7,013,446 B2* | 3/2006 | Ohba .................. G06F 17/5068 257/E21.583 |
| 7,039,890 B2* | 5/2006 | Takechi .............. G06F 17/5068 716/113 |

(Continued)

FOREIGN PATENT DOCUMENTS

| JP | 2012-212697 | 11/2012 |
| JP | 2016-105446 | 6/2016 |

*Primary Examiner* — Helen Rossoshek
(74) *Attorney, Agent, or Firm* — Fujitsu Patent Center

(57) ABSTRACT

A design support apparatus includes a storage that stores first layout data and pattern data, the first layout data indicating a circuit pattern of a design target circuit, the circuit pattern including circuit patterns, dummy patterns of the component circuits, and a wiring pattern, the component circuits being included in the design target circuit, the pattern data indicating a second dummy pattern, the second dummy pattern having a shape different from a shape of a first dummy pattern, the first dummy pattern being included in the first layout data, and a processor coupled to the storage, configured to specifies a component circuit, the specified component circuit being included in an area in the arrangement area, extracts pattern data indicating a dummy pattern, generates second layout data, the second layout data indicating a circuit pattern, and outputs the second layout data.

7 Claims, 20 Drawing Sheets

(56) References Cited

U.S. PATENT DOCUMENTS

| | | | |
|---|---|---|---|
| 7,062,732 B2 * | 6/2006 | Ito | G06F 17/5068 |
| | | | 716/55 |
| 7,161,248 B2 * | 1/2007 | Karasawa | H01L 23/5227 |
| | | | 257/200 |
| 7,242,095 B2 * | 7/2007 | Tabara | H01L 23/544 |
| | | | 257/758 |
| 7,269,807 B2 * | 9/2007 | Shimada | G06F 17/5081 |
| | | | 716/52 |
| 7,360,179 B2 * | 4/2008 | Smith | G06F 17/5068 |
| | | | 257/E21.525 |
| 8,024,689 B2 * | 9/2011 | Shinomiya | G06F 17/5077 |
| | | | 257/208 |
| 8,103,977 B2 * | 1/2012 | Taoka | E21B 43/24 |
| | | | 716/50 |
| 8,312,397 B2 * | 11/2012 | Inoue | G06F 17/5068 |
| | | | 257/202 |
| 9,508,559 B2 * | 11/2016 | Saito | H01L 21/32139 |
| 9,666,239 B2 * | 5/2017 | Naito | G11C 5/063 |
| 10,281,748 B2 * | 5/2019 | Sasaki | H04B 10/5051 |
| 2006/0223304 A1 * | 10/2006 | Suga | G06F 17/5068 |
| | | | 438/622 |
| 2006/0289750 A1 * | 12/2006 | Yamaguchi | G03F 1/00 |
| | | | 250/307 |
| 2007/0166887 A1 * | 7/2007 | Chen | G06F 17/5068 |
| | | | 438/129 |
| 2007/0200245 A1 * | 8/2007 | Suga | H01L 23/528 |
| | | | 257/773 |
| 2009/0031267 A1 * | 1/2009 | Ueki | G06F 17/5077 |
| | | | 716/119 |
| 2010/0003819 A1 * | 1/2010 | Taguchi | G06F 17/5068 |
| | | | 438/669 |
| 2012/0139101 A1 | 6/2012 | Shimada et al. | |
| 2014/0042640 A1 * | 2/2014 | Tsai | G06F 17/5072 |
| | | | 257/774 |
| 2016/0154920 A1 | 6/2016 | Harada | |

\* cited by examiner

| DENSITY RATIO | DATA ID | PATTERN DATA NAME |
|---|---|---|
| 5 | sample_p_5 | /library/sample_p_5.gds |
| 10 | sample_p_10 | /library/sample_p_10.gds |
| -5 | sample_m_5 | /library/sample_m_5.gds |
| -10 | sample_m_10 | /library/sample_m_10.gds |

| DENSITY RATIO | DATA ID | PATTERN DATA NAME |
|---|---|---|
| 0.5 | sample_p_0d5 | /library/sample_p_0d5.gds |
| 0.6 | sample_p_0d6 | /library/sample_p_0d6.gds |
| 0.7 | sample_p_0d7 | /library/sample_p_0d7.gds |
| 1.0 | sample_p_1d0 | /library/sample_p_1d0.gds |
| 3.0 | sample_p_3d0 | /library/sample_p_3d0.gds |
| -0.5 | sample_m_0d5 | /library/sample_m_0d5.gds |
| -0.6 | sample_m_0d6 | /library/sample_m_0d6.gds |
| -0.7 | sample_m_0d7 | /library/sample_m_0d7.gds |
| -1.0 | sample_m_1d0 | /library/sample_m_1d0.gds |
| -3.0 | sample_m_3d0 | /library/sample_m_3d0.gds |

FIG. 17

| DENSITY RULE NAME | ERROR TYPE | THE NUMBER OF ERRORS | DENSITY LIMIT VALUE | ERROR COORDINATES | DENSITY RATIO OF ERROR AREA | DIFFERENCE BETWEEN LIMIT VALUE AND ERROR DENSITY RATIO |
|---|---|---|---|---|---|---|
| density_01 | HIGH DENSITY | 1 | 70 | {10,10}{60,60} | 80 | 10 |
| density_02 | LOW DENSITY | 2 | 20 | {100,100}{200,200} | 15 | 5 |
|  |  |  |  | {150,150}{250,250} | 10 | 10 |
| density_03 | HIGH DENSITY | 3 | 75 | {500,550}{600,650} | 76 | 1 |
|  |  |  |  | {725,700}{825,800} | 85.2 | 10.2 |
|  |  |  |  | {250,50}{350,150} | 78.5 | 3.5 |

SUPPORT APPARATUS, DESIGN SUPPORT METHOD, AND DESIGN SUPPORT PROGRAM

CROSS-REFERENCE TO RELATED APPLICATION

This application is based upon and claims the benefit of priority of the prior Japanese Patent Application No. 2017-000359, filed on Jan. 5, 2017, the entire contents of which are incorporated herein by reference.

FIELD

The embodiment discussed herein is related to a design support apparatus, a design support method, and a design support program.

BACKGROUND

In layout design of a semiconductor integrated circuit (LSI: large scale integration), for example, an arrangement process is performed so that component circuits called standard cells, macro cells, and the like having transistors therein are arranged. In the layout design, a wiring process is performed so that the arranged component circuits are connected to each other by using a wiring pattern. Thus, layout data indicating a physical form pattern of an LSI is obtained.

In the layout design, it is determined whether or not the layout data complies with physical design rules called design rules. The determination as to whether or not the physical design rules are complied with is made by using a verification application called a design rule check (DRC) tool. When an error is detected by using a DRC tool, the layout data is modified.

One of the physical design rules is a density rule. The density rule stipulates the density of the circuit pattern disposed in a layout available area. The density is defined, for example, by using an area ratio in which figures corresponding to a circuit pattern occupy a given partitioned area. A density error affects, for example, a chemical mechanical planarization (CMP) process in manufacture of an LSI. Therefore, the density of the layout pattern is desirably uniform in each layer. When a difference in density is large, it is difficult to polish an LSI uniformly in the CMP process, and manufacturing defects and a decrease in yield may occur. For example, in a given wiring layer, excessive polishing may be performed in the CMP process on an area having a too low layout density, and a short circuit with a lower wiring layer may occur. In addition, for example, in a given wiring layer, polishing is not performed in the CMP process on an area having a too high layout density. Therefore, a short circuit between wiring lines in the same wiring layer may occur.

It may be difficult to comply with the density rule only by using the physical form pattern of an LSI. Therefore, the following technique of the related art is used. For example, the density rule is complied with by disposing a dummy pattern in an available area in which a physical form pattern is not disposed. A dummy pattern is disposed, for example, by using an application such as a dummy generating tool which is capable of disposing a dummy pattern automatically after completion of the arrangement process and the wiring process.

In the related art, the following technique is used. Arrangement candidate areas, in each of which, on a lower level, no dummy patterns are disposed between a circuit block boundary and a dummy pattern, are present. A dummy pattern is disposed on an upper level in a portion obtained by combining some of the arrangement candidate areas. The circuit blocks having the combined arrangement candidate areas are in contact with each other. In the related art, a technique is used in which, in a semiconductor apparatus having a multilayer wiring configuration, a dummy pattern oriented in a direction difference from that of a dummy pattern formed in a wide wiring gap is formed in a narrow wiring gap.

However, a problem arises in that efficiency in the layout design may be deteriorated in a dummy pattern generating process. For example, when dummy patterns are generated at a time for the entire design target circuit, it takes time to generate dummy patterns so as to satisfy all of the physical design rules including various rules. In addition, for example, when a layout operation is performed by using a bottom-up hierarchical design method in which a semiconductor integrated circuit divided into multiple hierarchical levels is designed from a lower level to an upper level, a density error may occur on an upper level regardless of no density errors on the lower levels. In this case, to clear a density error on an upper level, redesign may take place. For example, the design process is returned to a lower level, and the physical form pattern and the dummy pattern may be modified.

The followings are reference documents.
[Document 1] Japanese Laid-open Patent Publication No. 2016-105446 and
[Document 2] Japanese Laid-open Patent Publication No. 2012-212697.

SUMMARY

According to an aspect of the invention, a design support apparatus includes a storage that stores first layout data and pattern data, the first layout data indicating a circuit pattern of a design target circuit in a given arrangement area, the circuit pattern including circuit patterns of component circuits, dummy patterns of the component circuits, and a wiring pattern, the component circuits being included in the design target circuit, the wiring pattern coupling between the component circuits, the pattern data indicating, for each of the component circuits, a second dummy pattern for the component circuit, the second dummy pattern having a shape different from a shape of a first dummy pattern of the component circuit, the first dummy pattern being included in the first layout data, and a processor coupled to the storage, configured to specifies a component circuit among the component circuits in the first layout data stored in the storage, the specified component circuit being included in an area in the arrangement area, the area being an area in which a circuit pattern density does not satisfy a constraint, extracts, from the storage, pattern data indicating a dummy pattern for the specified component circuit, generates second layout data based on the first layout data and the extracted pattern data, the second layout data indicating a circuit pattern obtained by replacing the dummy pattern of the specified component circuit with the dummy pattern for the component circuit, the dummy pattern for the component circuit being indicated by the extracted pattern data, and outputs the second layout data when a density of the circuit pattern in the generated second layout data satisfies the constraint.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is a diagram for describing first exemplary storage of registration information;

FIG. 16 is a diagram for describing second exemplary storage of registration information;

FIG. 17 is a diagram for describing exemplary storage of an error list;

DESCRIPTION OF EMBODIMENT

An embodiment of the present disclosure for a design support apparatus, a design support method, and a design support program will be described in detail below with reference to the attached drawings.

Figure 1:
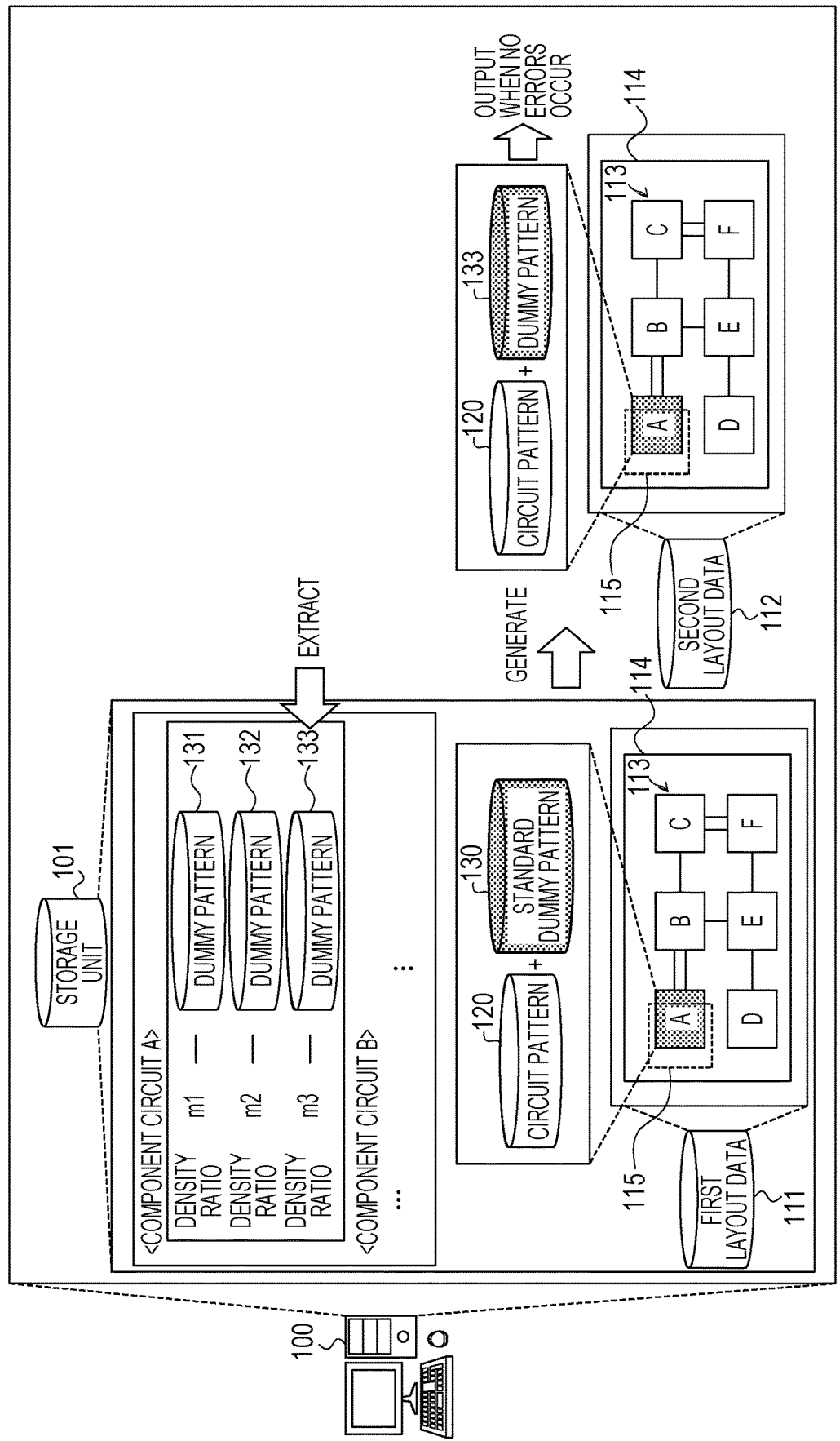
FIG. 1 is a diagram for describing exemplary operations of a design support apparatus according to an embodiment.

FIG. 1 is a diagram for describing exemplary operations of a design support apparatus according to the embodiment. A design support apparatus 100 is a computer that supports layout design of a large-scale integrated circuit (LSI).

As described above, heretofore, it has been determined whether layout data complies with physical design rules, in layout design of an LSI. One of the physical design rules is a density rule. The density rule is a rule stipulating the density of a circuit pattern in which circuits are arranged in a layout available area. In addition, it may be difficult to comply with the density rule only by using the physical form pattern of an LSI. In this case, heretofore, a technique has been used in which the density rule is complied with, for example, by disposing a dummy pattern in an available area in which a physical form pattern is not disposed. An example in which a dummy pattern is generated and an example in which it is determined whether or not the density rule is complied with will be described below by using FIGS. 5 to 8.

However, in the related art, there arises a problem in that layout design may be inefficiently performed in a dummy pattern generating process. For example, in the dummy pattern generating process, the following two methods are employed: a method of generating dummy patterns at a time for the entire design target circuit 113; and a method of generating dummy patterns for each hierarchical level in a hierarchical design method.

For example, when dummy patterns are generated at a time for the entire design target circuit 113, it takes time to generate dummy patterns so that all of the physical design rules containing various stipulations are complied with.

For example, in a layout operation using a bottom-up hierarchical design method in which design is performed from a lower level to an upper level, even in the case where no density errors occur on a lower level, a density error may occur on an upper level. In this case, to clear a density error on an upper level, redesign may take place. For example, the design process is returned to a lower level, and a physical form pattern or a dummy pattern may be modified. An example in which, even in the case where no density errors occur on a lower level, a density error occurs on an upper level will be described by using FIGS. 9 and 10. An example in which redesign takes place in the case where a layout operation is performed by using a bottom-up hierarchical design method will be described briefly by using FIG. 3.

The density rule may include a density difference rule. In the density difference rule, the difference in density between a check window and an adjacent area to the check window is checked. When a high-density circuit is adjacent to a low-density circuit, a density difference error is highly likely to occur. However, in lower-level layout design, it has not been determined which circuit patterns are adjacent to each other in upper-level layout design. Therefore, redesign, such as a change in a lower-level circuit pattern due to a density difference error occurring in upper-level design, may take place.

For example, to clear a density error on an upper level, a lower-level circuit pattern may be modified. In this case, in a lower-level layout operation, it may be checked if the density in an area in which the density error has occurred is increased or decreased, but it is not possible to check whether or not the density error has been cleared on the upper level. Therefore, after completion of a lower-level layout operation, design rule check (DRC) has to be performed again in an upper-level layout operation. When the density error has not been cleared on the upper level, the design process is returned to a lower level, and the density is adjusted. Thus, in a bottom-up hierarchical design method, an operation for clearing a density error may be repeatedly performed, resulting in a problem of an increase in design man-hour.

Therefore, in the present embodiment, the design support apparatus 100 changes the dummy pattern of a component circuit that is present in a density error area in a target circuit, to one of the dummy patterns having different shapes. The dummy patterns have been prepared for each component circuit in the target circuit. Then, the design support apparatus 100 generates layout data satisfying the density constraint. Thus, the dummy pattern of a lower-level component circuit may be adjusted in upper-level design, and the density of the target circuit may be easily adjusted. Therefore, occurrence of redesign may be suppressed.

In the present embodiment, a circuit to be a target of upper-level layout design is called a target circuit, and a circuit to be a target of lower-level layout design is called a component circuit. In the example in FIG. 1, a target circuit to be a target of upper-level layout design includes lower-level component circuits A to F. Exemplary levels, such as an upper level and a lower level, will be described by using FIG. 2.

In the present embodiment, a physical form pattern is also called a circuit pattern. Examples of a physical form pattern include patterns, such as a wiring pattern representing wiring, a diffusion area pattern representing diffusion areas, and a polysilicon pattern representing polysilicon. A pattern obtained by merging a physical form pattern with a dummy pattern is also called a circuit pattern. A pattern obtained by merging a circuit pattern with a dummy pattern is also called a layout pattern.

In the present embodiment, in design of an upper-level target circuit, the layout pattern of a lower-level component circuit is handled as a part of the circuit pattern of the target circuit. The dummy pattern of an upper-level target circuit indicates a dummy pattern generated in layout design of the target circuit. For example, the circuit pattern of a target circuit includes the layout patterns of the component circuits and a wiring pattern connecting the component circuits to each other. The layout pattern of a target circuit includes the circuit pattern of the target circuit and the dummy pattern of the target circuit.

An arrangement area is an area in which a pattern may be disposed in layout design. An arrangement area is also called a layout area. In the example in FIG. 1, an arrangement area is a layout area 114. An orthogonal coordinate system, such as the X axis and the Y axis, is defined in the layout area 114.

A storage unit 101 is implemented, for example, by using a random access memory (RAM), a read only memory (ROM), a disk, and a nonvolatile semiconductor memory which are included in the design support apparatus 100. The storage unit 101 stores, for example, first layout data 111 and pattern data such as pattern data 131 to 133. The first layout data 111 and the pattern data such as the pattern data 131 to 133 describe various patterns, for example, in the graphic data system (GDS) format.

The first layout data 111 is obtained by laying out the target circuit 113. The first layout data 111 indicates the circuit pattern of the target circuit 113 including the circuit pattern of each of the component circuits A to F in the layout area 114 of the target circuit 113, the dummy pattern of each component circuit, and a wiring pattern for connection among the component circuits. Specifically, the first layout data 111 indicates a layout pattern obtained, for example, by combining together the layout patterns of the component circuits A to F, the wiring pattern for connection among the component circuits, and a dummy pattern generated for the target circuit 113.

The layout data indicating the component circuit A is generated, for example, by merging layout data 120 indicating the circuit pattern of the component circuit A, with pattern data 130 indicating a dummy pattern.

Pattern data indicates dummy patterns having shapes different from that of the dummy pattern of a component circuit in the first layout data 111. For each of the component circuits A to F, the storage unit 101 stores, for example, pattern data indicating dummy patterns having shapes different from that of a corresponding standard dummy pattern. The standard dummy pattern is a dummy pattern included in the layout pattern indicated by the layout data of each component circuit. The standard dummy pattern is a dummy pattern generated, for example, so that a standard density ratio is obtained.

A dummy pattern having a different shape may be, for example, a dummy pattern having a different shape in such a manner as to have a different density, or may be a dummy pattern for which the density is the same but only the shape is different. For example, if dummy patterns are laid out so that the densities are different from each other, the shapes of the dummy patterns are different from each other. When an algorithm used in a dummy generating process is different, a dummy pattern for which the density is the same and the shape is different may be generated. Therefore, dummy patterns having the same density and different shapes may be generated, for example, by using multiple dummy generating tools using different processing algorithms. For example, a dummy generating tool generates a dummy pattern for the specified density ratio. A density ratio is an index of density. A density ratio is, for example, an area ratio indicating how much figures representing a pattern occupy the layout area of a circuit. If different processing algorithms are used, even when the specified density ratio is the same, the shapes of the resulting dummy patterns may be different. The case in which densities are the same encompasses not only a case in which the densities match each other but also a case in which the difference between the densities falls within a given ratio.

FIG. 1 illustrates an example in which multiple pieces of pattern data of dummy patterns for which the density ratios are different from that for the standard dummy pattern and for which the density ratios are different from each other are prepared for each component circuit.

When the component circuit A is taken as an example, for each of density ratios m1 to m3, the storage unit 101 stores information indicating the density ratio, in association with a corresponding one of the pattern data 131 to 133 indicating a dummy pattern for the density ratio obtained when the dummy pattern is merged with the circuit pattern. Thus, the design support apparatus 100 may refer to the storage unit 101 to search for pattern data indicating the dummy pattern corresponding to a density ratio.

For example, in the first layout data 111, the design support apparatus 100 specifies, among the component circuits A to F, a component circuit included in an area, of the layout area 114, in which the density of the circuit pattern of the target circuit 113 does not satisfy the constraint. The constraint is the density rule included in the above-described DRC rule. The density rule includes, for example, the upper limit of the density ratio and the lower limit of the density ratio. In addition, the density rule includes, for example, the density difference rule stipulating the upper limit of the density difference and the lower limit of the density difference. The area is, for example, an area overlain by the check window for determining, by using a DRC tool, whether or not the density rule is satisfied. The check window has any size. The DRC tool provides the check window, for example, in the layout area 114 of the target circuit 113. The DRC tool determines whether or not the density ratio in the check window satisfies the density rule. The DRC tool moves the check window sequentially, for example, starting from the origin of the layout area 114, and checks the density ratio of the entire layout area 114. Thus, an area in which a density error occurs is also called an error area. FIG. 1 illustrates an error area 115. The design support apparatus 100 may specify a component circuit of which at least a part is included in the error area 115, or may specify a component circuit that is completely included in the error area 115. In the example in FIG. 1, the design support apparatus 100 specifies the component circuit A of which at least a part is included in the error area 115.

The design support apparatus 100 refers to the storage unit 101, and extracts pattern data indicating a dummy pattern which is a pattern for the specified component circuit and of which the shape is different from that of the standard dummy pattern of the specified component circuit. The design support apparatus 100 extracts the pattern data 131 to 133 as pattern data indicating dummy patterns of which the shapes are different from that of the standard dummy pattern of the component circuit A.

The design support apparatus 100 may change target pattern data that is to be extracted, in accordance with the type of a density error. Examples of the type of a density error include three types. The first type is a "high density error" indicating that a state in which the constraint about the upper limit of the density ratio is not satisfied is detected. The second type is a "low density error" indicating that a state in which the constraint about the lower limit of the density ratio is not satisfied is detected. The third type is a "density difference error" indicating that a state in which the constraint about the difference between the density ratio and that of an adjacent area is not satisfied is detected. A process of extraction in accordance with the type of a density error will be described in detail below. A description will be made by taking the "high density error" as an example.

In the case where a density error is the "high density error", the design support apparatus 100 changes the dummy pattern of the component circuit A so that the density of the error area 115 decreases. For example, assume a relationship of "the density ratio m1>the density ratio m2>the density ratio for the standard dummy pattern of the component circuit A>the density ratio m3". When a density error is the "high density error", the design support apparatus 100 extracts, from the storage unit 101, the pattern data 133 corresponding to the density ratio m3 that is lower than the density ratio for the standard dummy pattern of the component circuit A.

The design support apparatus 100 generates second layout data 112 based on the first layout data 111 and the extracted pattern data. The second layout data 112 indicates a circuit pattern of the target circuit 113 in which the dummy pattern of the specified component circuit in the layout area 114 is the dummy pattern of the component circuit which is indicated by the extracted pattern data. Specifically, the design support apparatus 100 may generate the second layout data 112 in which, for example, the pattern data indicating the dummy pattern of the specified component circuit included in the first layout data 111 is replaced with the extracted pattern data.

When, in the second layout data 112, the density of the layout pattern of the target circuit 113 satisfies the constraint, the design support apparatus 100 outputs the second layout data 112. The design support apparatus 100 outputs the second layout data 112 in such a manner that, for example, the first layout data 111 is deleted and the storage unit 101 or the like stores the second layout data 112.

Whether or not the density of the layout pattern of the target circuit 113 satisfies the constraint in the second layout data 112 may be determined, for example, by using a DRC tool. The DRC tool may operate on the design support apparatus 100, or may operate on another apparatus which may be accessed by the design support apparatus 100. Specifically, for example, the design support apparatus 100 outputs, to the DRC tool, an instruction to perform DRC by using the second layout data 112 as input. Thus, the design support apparatus 100 may obtain a verification result about whether or not the density of the layout pattern of the target circuit 113 satisfies the constraint.

Thus, dummy patterns having different shapes are prepared in advance, enabling the design support apparatus 100 to easily adjust the density of the layout pattern of a lower-level component circuit. Therefore, the design support apparatus 100 may suppress reoccurrence of a layout design operation and the like on a lower-level component circuit. In addition, the design support apparatus 100 may suppress a prolonged design time caused by redesign.

In the case where it is determined that an area in which the density of the layout pattern of the target circuit 113 does not satisfy the constraint is present in the second layout data 112, multiple pieces of pattern data may be extracted. In this case, the design support apparatus 100 may sequentially replace the pattern data of the specified component circuit until the density of the layout pattern of the target circuit 113 satisfies the constraint. In addition, in the case where it is determined that an area in which the density of the layout pattern of the target circuit 113 does not satisfy the constraint is present in the second layout data 112, multiple component circuits may be specified. In this case, the design support apparatus 100 may sequentially replace the pattern data of the different component circuits until the density of the layout pattern of the target circuit 113 satisfies the constraint.

Figure 2:
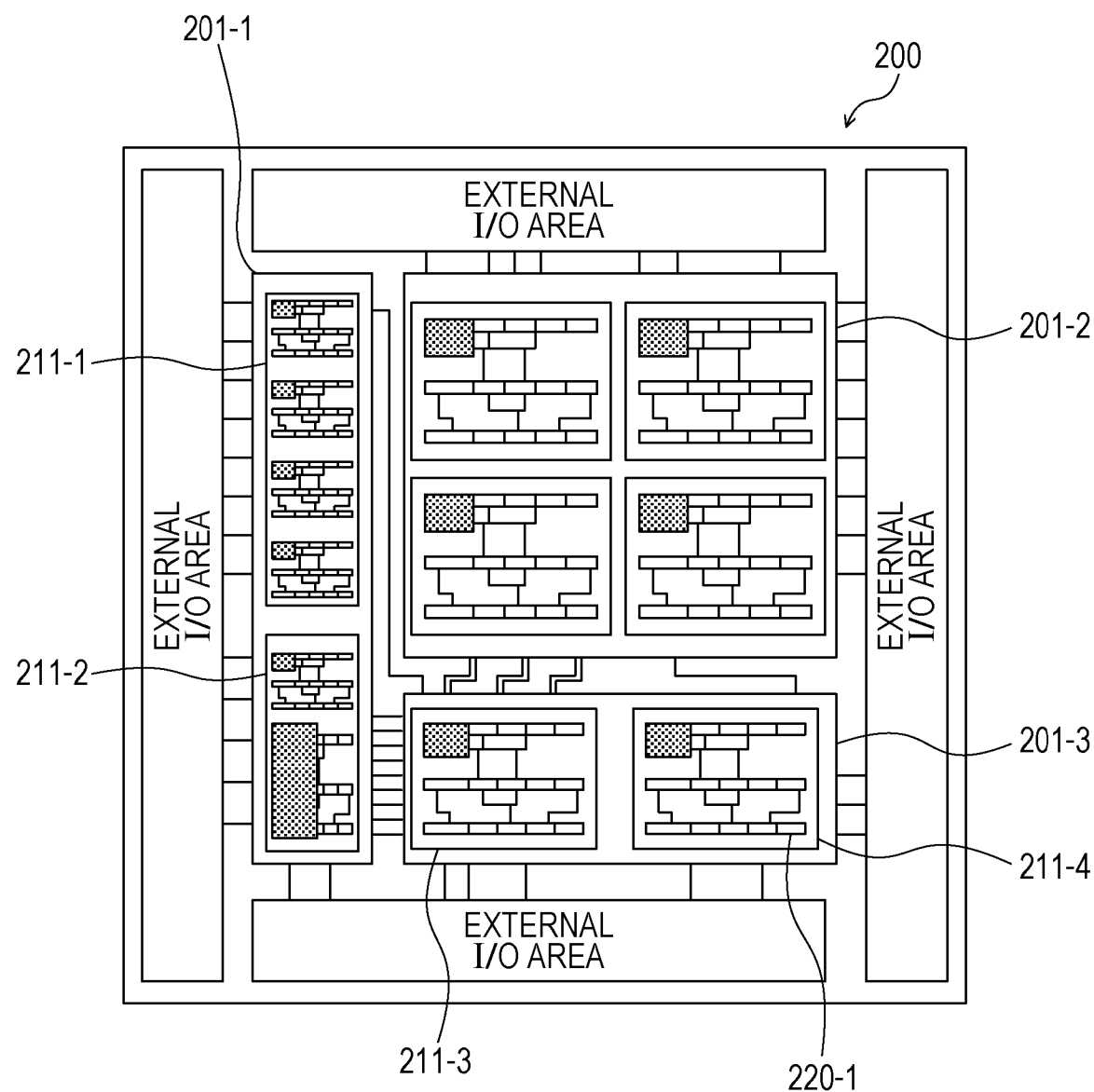
FIG. 2 is a diagram for describing an exemplary hierarchical structure of a large-scale integrated circuit (LSI)

FIG. 2 is a diagram for describing an exemplary hierarchical structure of an LSI. In the case where a circuit to be designed is large, such as an LSI, the layout design operation is divided into multiple hierarchical levels. In the example in FIG. 2, the entire LSI 200 is divided into sub-chips 201. Each sub-chip 201 is divided into blocks 211. A block 211 includes cells 220, such as standard cells and macro cells.

In FIG. 2, for example, a layout design operation on the LSI 200 is performed for each of the four hierarchical level structures, that is, the LSI level, the sub-chip level, the block level, and the cell level for standard cells and macro cells. In the present embodiment, a bottom-up design method in which operations are sequentially performed from the lowest level for standard cells and macro cells to a higher level is used as a layout design method.

In the example in FIG. 2, an example in which the LSI 200 is laid out in the four hierarchical level structure is described. However, this is not limiting. The LSI 200 may be laid out in a structure of two hierarchical levels, three hierarchical levels, or five hierarchical levels or more. For example, in use of a hierarchical design method, different designers may work for the respective hierarchical levels. Therefore, in the related art, when a density error occurs in upper-level design, a designer for an upper level asks a designer for a lower level to redesign the layout pattern of a lower-level component circuit. A problem arises in that time and effort are taken for both the designer for an upper level and the designer for a lower level. In the present embodiment, occurrence of layout redesign on a lower level may be suppressed, enabling time and effort of the designers to be saved.

In the example in FIG. 2, when the block level serves as an upper level, the standard/macro cell level is its lower level. When the sub-chip level serves as an upper level, the block level and the standard/macro cell level are its lower levels. When the LSI level serves as an upper level, the sub-chip level, the block level, and the standard/macro cell level are its lower levels.

Figure 3:
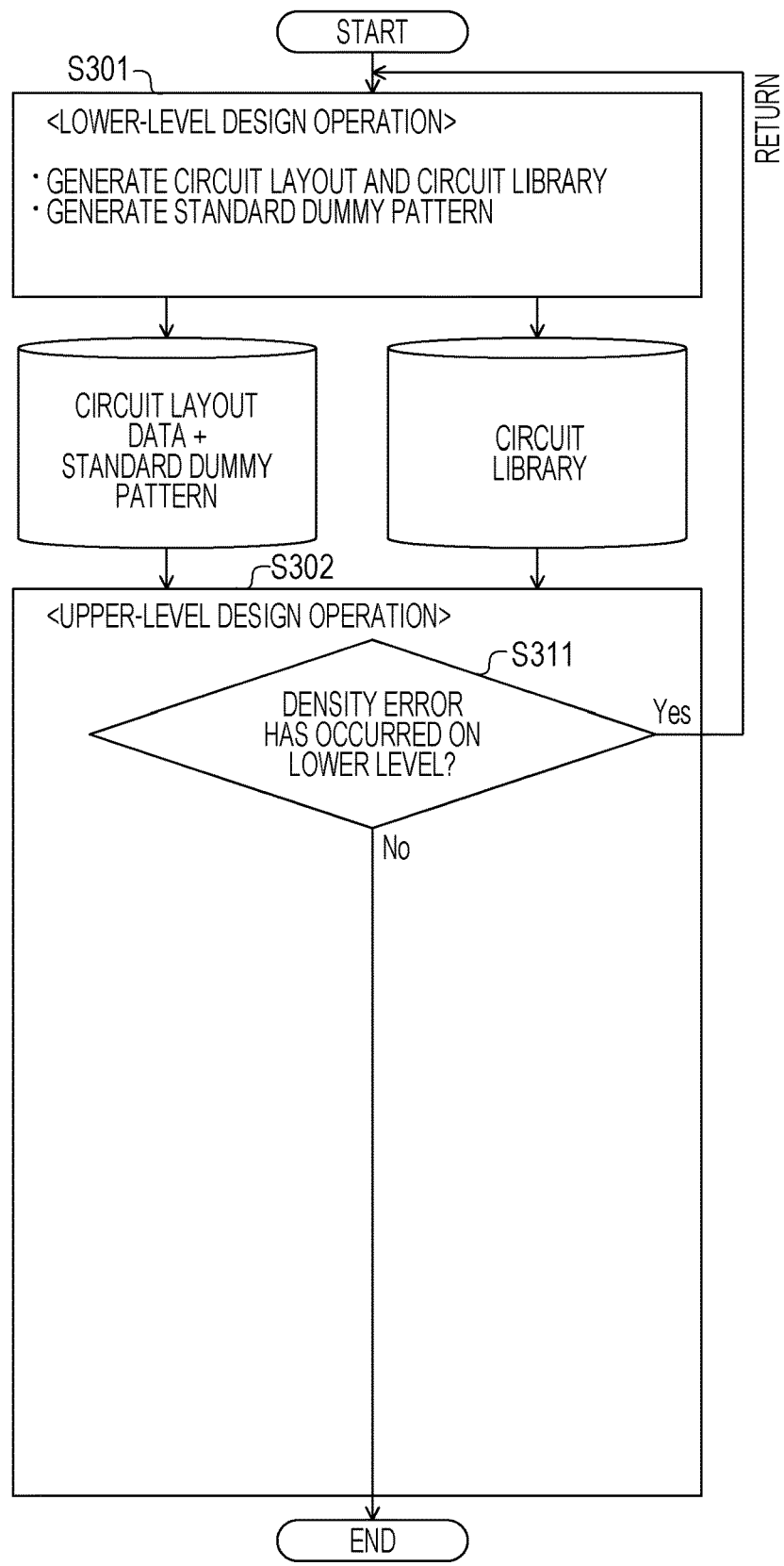
FIG. 3 is a flowchart of an exemplary layout design procedure using a hierarchical design method of the related art.

FIG. 3 is a flowchart of an exemplary layout design procedure using a hierarchical design method of the related art. In the related art, a lower-level design operation is performed (step S301). In the lower-level design operations, a circuit layout generating process, a circuit library generating process a, and a standard dummy pattern generating process are performed. In the standard dummy pattern generating process, for example, a dummy pattern is generated so that a specified standard density ratio is satisfied. A dummy pattern for the specified standard density ratio is a standard dummy pattern, and is included in the layout pattern indicated by the layout data of a component circuit.

In the related art, an upper-level design operation is performed (step S302). In step S302, after upper-level circuit layout data is generated, it is determined whether or not a density error has occurred on a lower level (step S311). If it is determined that a density error has occurred on a lower level, the lower-level design operation is performed again (Yes in step S311). In contrast, if it is determined that no density errors have occurred on the lower levels (No in step S311), the upper-level design operation ends.

Thus, in the related art, for example, when a density error occurs on a lower level in circuit layout data obtained through the upper-level design operation, the process is returned to the lower-level design operation, and a lower-level component circuit is laid out.

Figure 4:
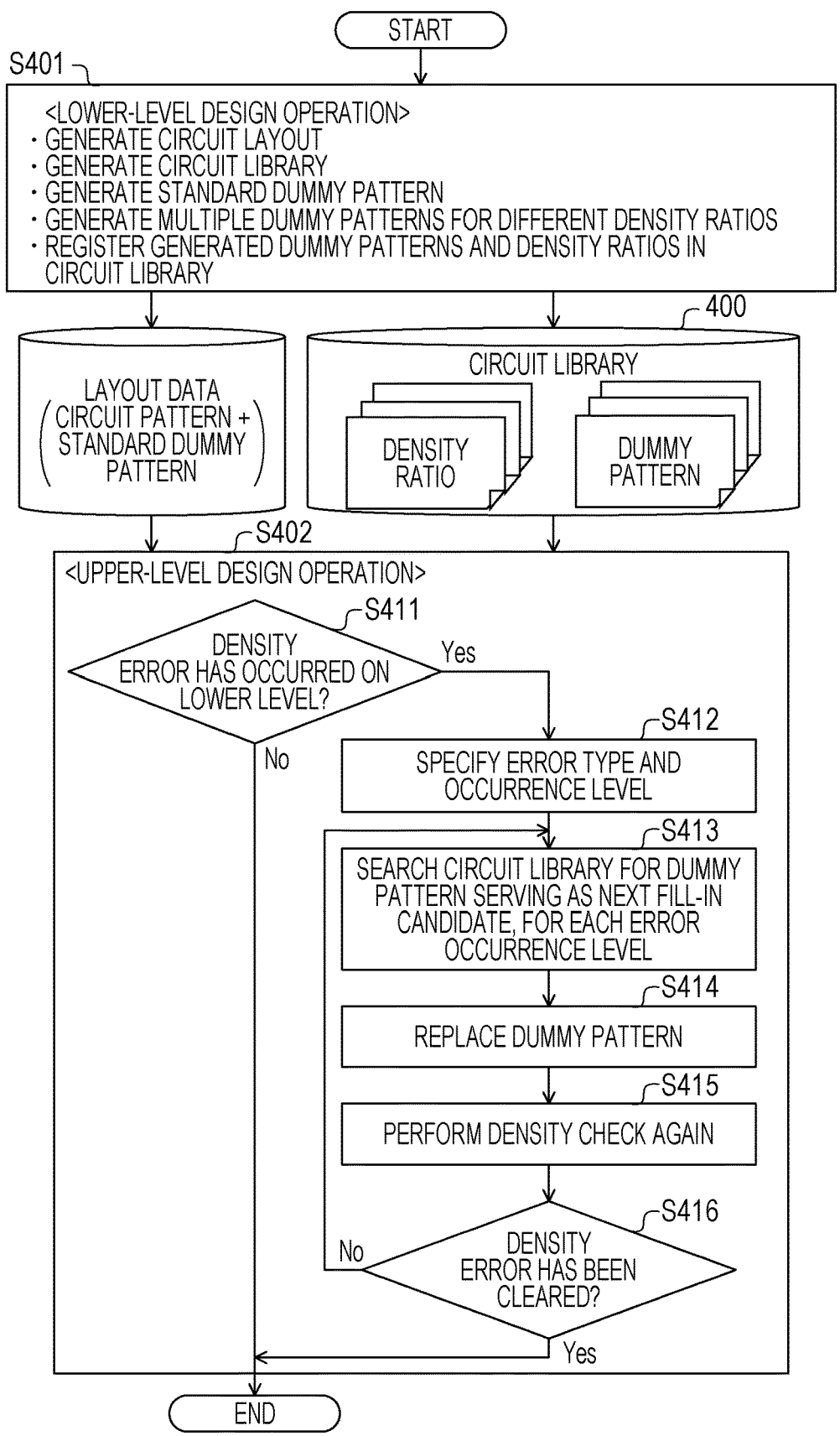
FIG. 4 is a flowchart of an exemplary layout design procedure using a hierarchical design method according to the embodiment.

FIG. 4 is a flowchart of an exemplary layout design procedure using a hierarchical design method according to the present embodiment. FIG. 4 illustrates a simplified flow in order to compare the layout design procedure in the related art in FIG. 3 with the layout design procedure according to the present embodiment.

The design support apparatus 100 performs a lower-level design operation (step S401). In step S401, the design support apparatus 100 performs a circuit layout generating process, a circuit library generating process, and a standard dummy pattern generating process. In step S401, the design support apparatus 100 generates multiple dummy pattern for different density ratios. The circuit layout generating process is, for example, a process of generating layout data indicating a circuit pattern. The standard dummy pattern generating process is a process of generating pattern data indicating a dummy pattern so that the standard density ratio is obtained. The circuit library generating process is a process of generating pattern data that indicates multiple dummy patterns for density ratios different from that of the standard density ratio and making a library for the pattern data in a circuit library 400. In step S401, the design support apparatus 100 registers, in the circuit library 400, the pattern data indicating generated dummy patterns, in association with information indicating the density ratios.

The design support apparatus 100 performs an upper-level design operation (step S402), and ends the series of processes. In step S402, after upper-level circuit layout data is generated, the design support apparatus 100 determines whether or not density errors have occurred on the lower levels (step S411). If it is determined that no density errors have occurred on the lower levels (No in step S411), the design support apparatus 100 ends the series of processes.

In contrast, if it is determined that density errors have occurred on the lower levels (Yes in step S411), the design support apparatus 100 specifies the error types and the levels on which the density errors have occurred (step S412). The design support apparatus 100 searches the circuit library for a dummy pattern serving as a next fill-in candidate, for the level on which each error has occurred (step S413). The design support apparatus 100 replaces the dummy patterns (step S414). The design support apparatus 100 performs density check again (step S415). The design support apparatus 100 determines whether or not the density errors have been cleared (step S416). If it is determined that the density errors have not been cleared (No in step S416), the design support apparatus 100 returns the process to step S413. If it is determined that the density errors have been cleared (Yes in step S416), the design support apparatus 100 ends the series of processes.

Thus, in FIG. 4, compared with FIG. 3, reoccurrence of the lower-level design operation may be reduced. Therefore, the number of redesign operations may be reduced, achieving a reduction in design time.

Before the processes performed by the design support apparatus 100 are described in detail, examples of generation of a dummy pattern and check of a density error will be briefly described by using FIGS. 5 to 10.

Figure 5:
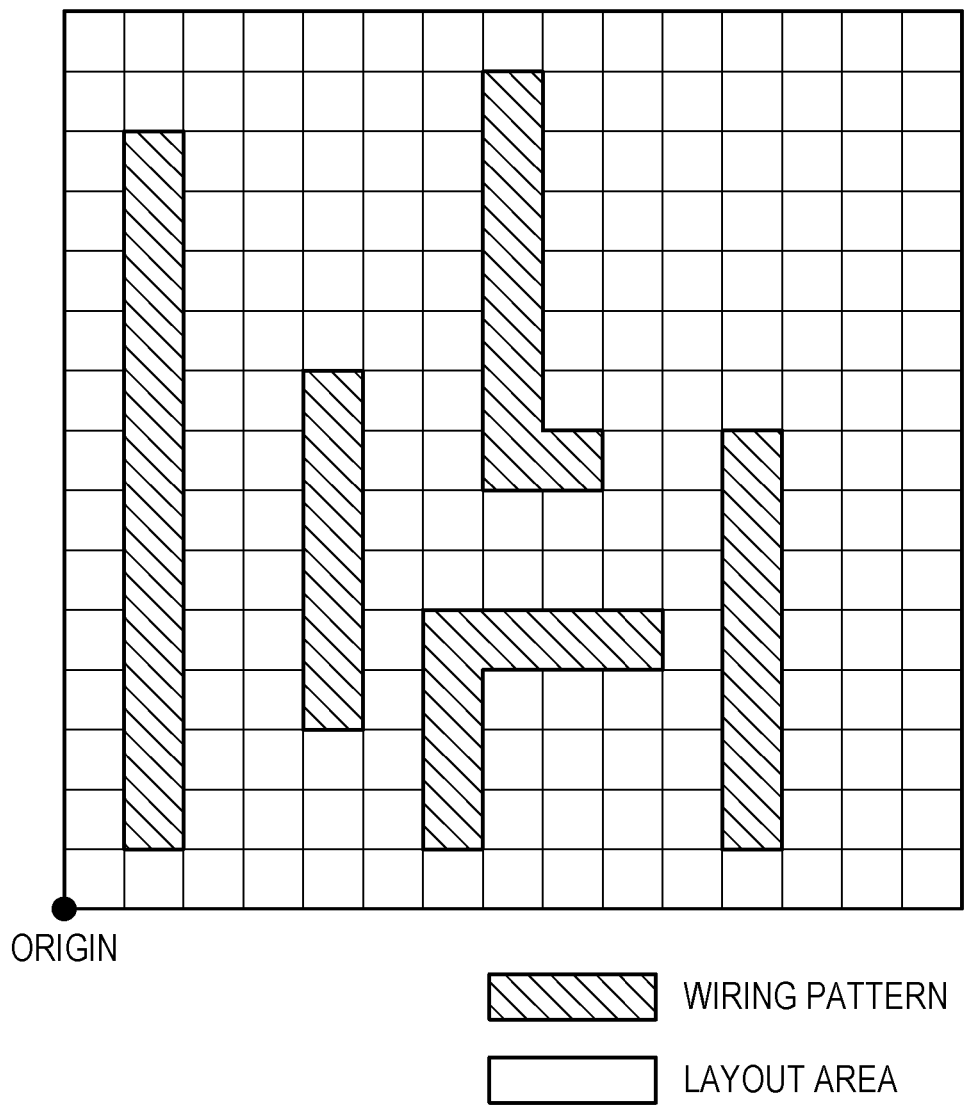
FIG. 5 is a diagram for describing an exemplary circuit pattern obtained before a dummy pattern generating process and a merge process.

FIG. 5 is a diagram for describing an exemplary circuit pattern obtained before a dummy pattern generating process and a merge process. FIG. 5 illustrates a circuit pattern in a given wiring layer. In FIG. 5, the origin is positioned at the lower left corner of the layout area.

Figure 6:
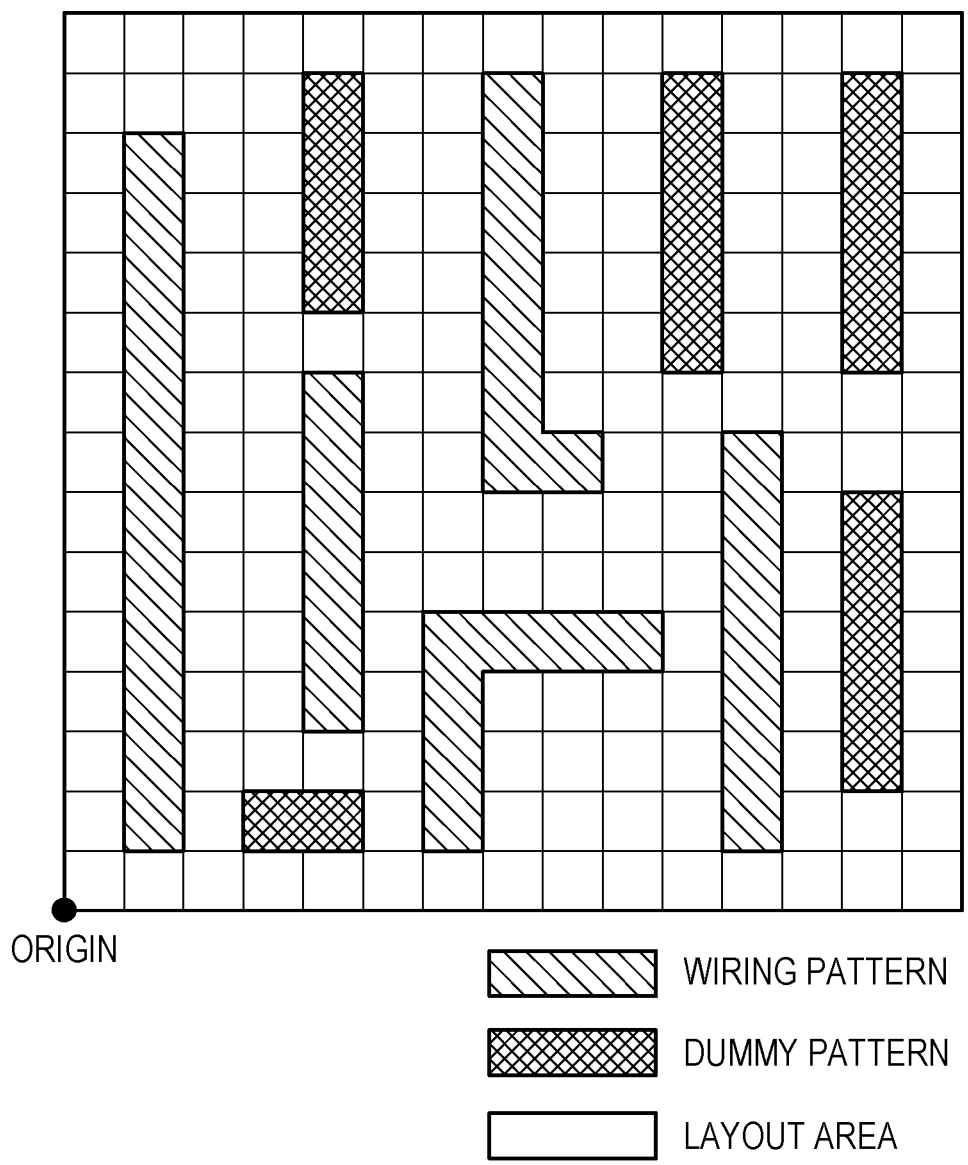
FIG. 6 is a diagram for describing a first exemplary circuit layout pattern obtained after a dummy pattern generating process and a merge process.
Figure 7:
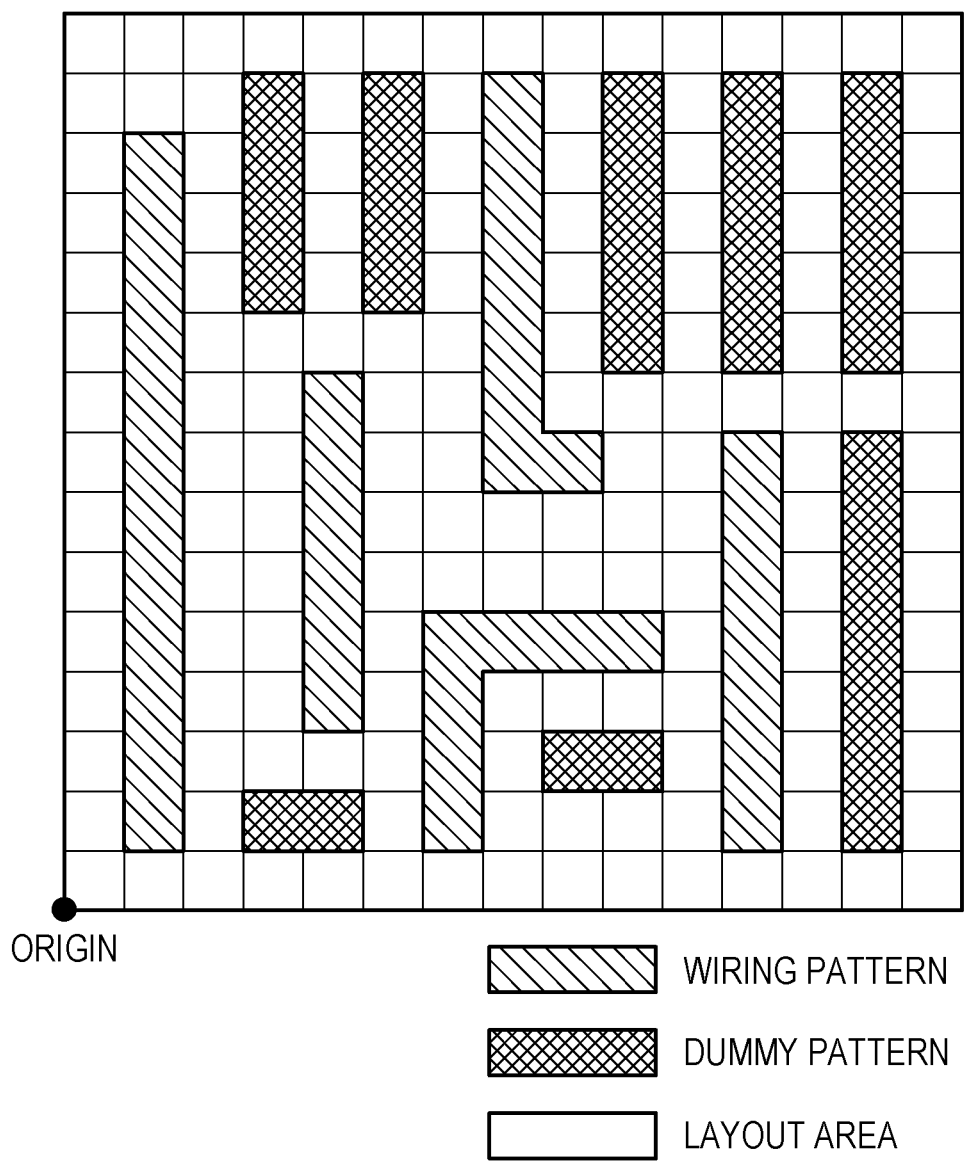
FIG. 7 is a diagram for describing a second exemplary circuit layout pattern obtained after a dummy pattern generating process and a merge process.

FIGS. 6 and 7 are diagrams for describing exemplary circuit layout patterns obtained after a dummy pattern generating process and a merge process. FIGS. 6 and 7 illustrate layout patterns obtained after a dummy pattern is merged with the circuit pattern illustrated in FIG. 5. The dummy pattern is generated in a dummy pattern generating process so that a specified density ratio is satisfied. As the method used in the dummy pattern generating process, an application, such as a dummy generating tool for a dummy pattern generating process, may be used, but this is not particularly limiting. FIG. 6 illustrates an example obtained when the specified density ratio is 25%. FIG. 7 illustrates an example obtained when the specified density ratio is 50%.

DRC has a design rule also for a generated dummy pattern. In FIGS. 6 and 7, the design rule stipulates that, for example, the minimum size of a trace of a dummy pattern is 2×1 (1 μm) squares and the minimum gap in a dummy pattern is 1 square (1 μm). A dummy pattern is to be generated so that the design rule is complied with.

A generated dummy pattern is merged with a circuit pattern so that layout data indicating the layout pattern satisfying a specified density ratio is obtained.

An example of detection of a density error and a change of the origin using a DRC tool will be described by using FIGS. 8 to 10. The DRC tool provides a check window on a circuit pattern or a layout pattern. While the DRC tool moves the check window, the DRC tool checks whether or not the pattern in the check window satisfies a density limit range. In this example, the density limit, the window size, the amount of window movement are determined as follows. A small amount of window movement increases the number of check operations. A large amount of window movement decreases the number of check operations.

The density limit range: 15% to 85%
The window size: 4 μm² (16 squares of 4×4 squares)
The amount of window movement: 2 μm (2 squares)

Figure 8:
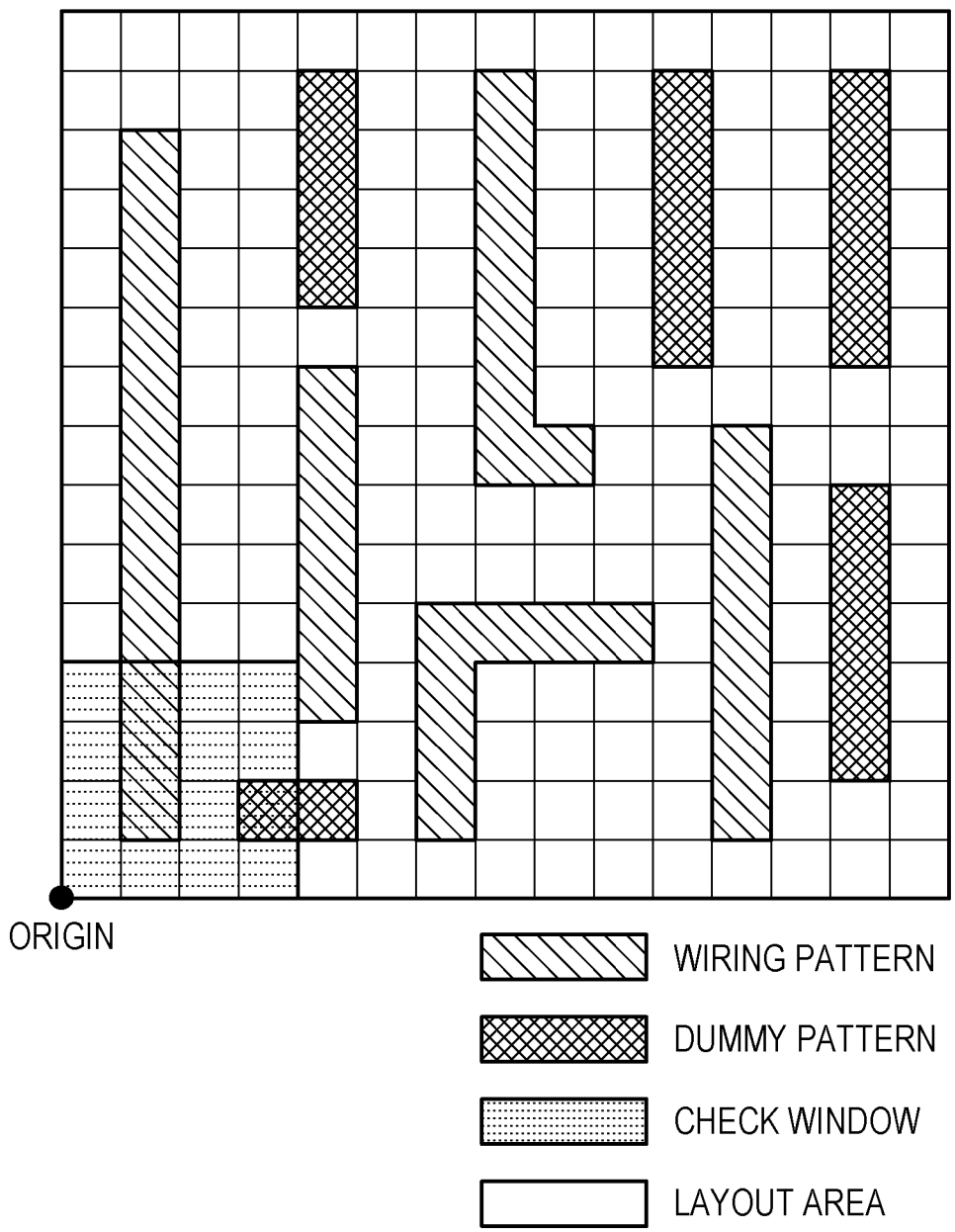
FIG. 8 is a diagram for describing an exemplary initial arrangement of a check window.

FIG. 8 is a diagram for describing an exemplary initial arrangement of a check window. For example, as an initial arrangement, the DRC tool disposes a check window of 4 μm² at the origin using as a reference. Since the check window is 16 squares, the area ratio for one square is 6.25% (100/16%).

Figure 9:
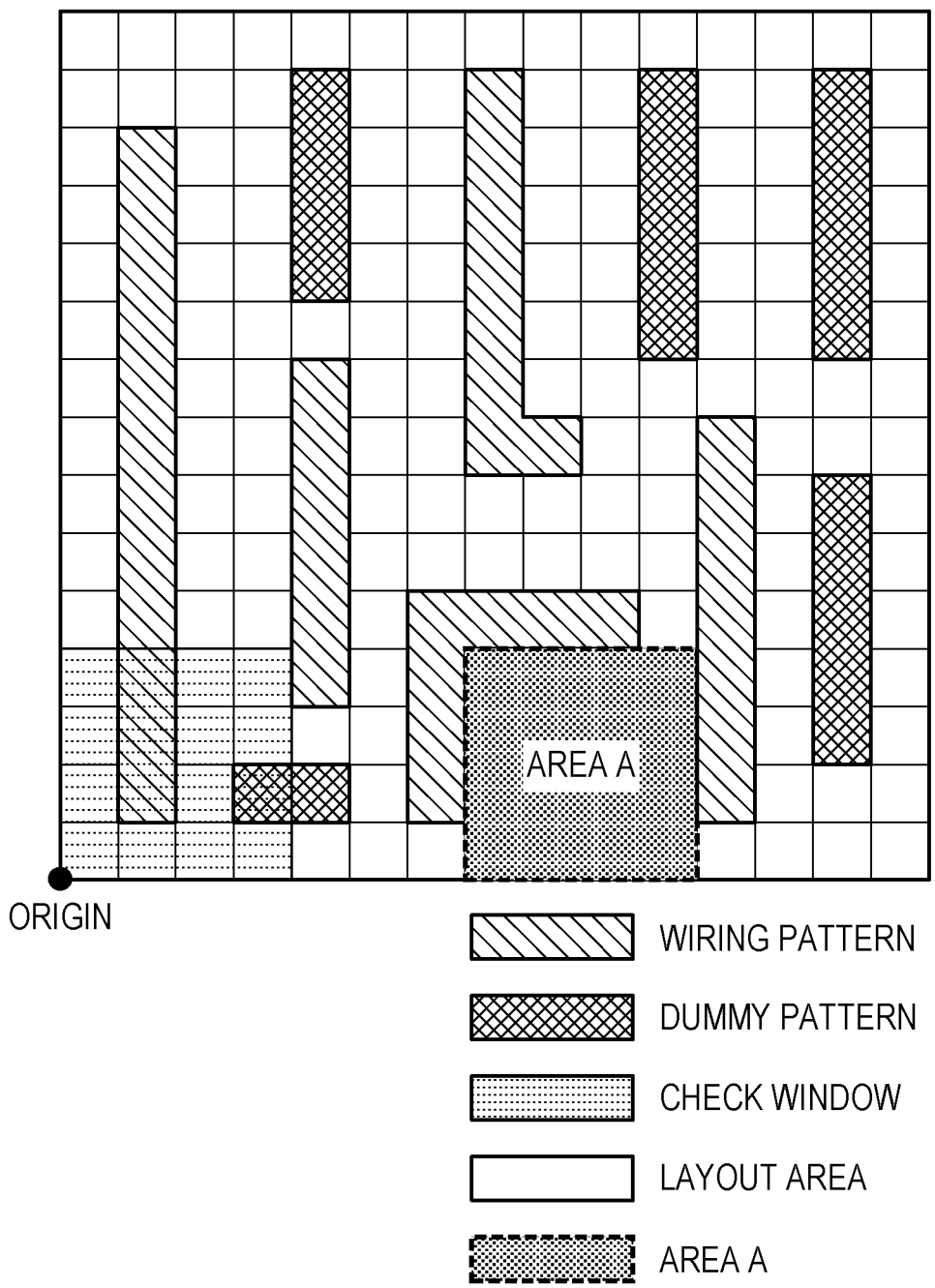
FIG. 9 is a diagram for describing an example of a density error and a check window.

In the example in FIG. 9, the total, in the check window in the initial arrangement, of the wiring pattern and the dummy pattern is four squares. The area ratio for the total, in the check window, of the wiring pattern and the dummy pattern is 25% (6.25%×4). The area ratio for the total, in the check window in the initial arrangement, of the wiring pattern and the dummy pattern falls within the density limit range. Therefore, it is determined that no density errors occur in the initial arrangement.

Then, the DRC tool moves the check window from the origin 2 μm in the X axis direction. In the arrangement after the movement, it is determine whether or not the area ratio of the total, in the check window, of the patterns falls within the density limit range.

FIG. 9 is a diagram for describing an example of a density error and the check window. As illustrated in FIG. 9, the area A has the same size as the check window. The area ratio of the total, in the area A, of the wiring pattern and the dummy pattern is 0%. However, the check window is moved from the origin repeatedly by 2 μm, and the check window does not match the area A. Therefore, no density errors are detected in the area A.

Figure 10:
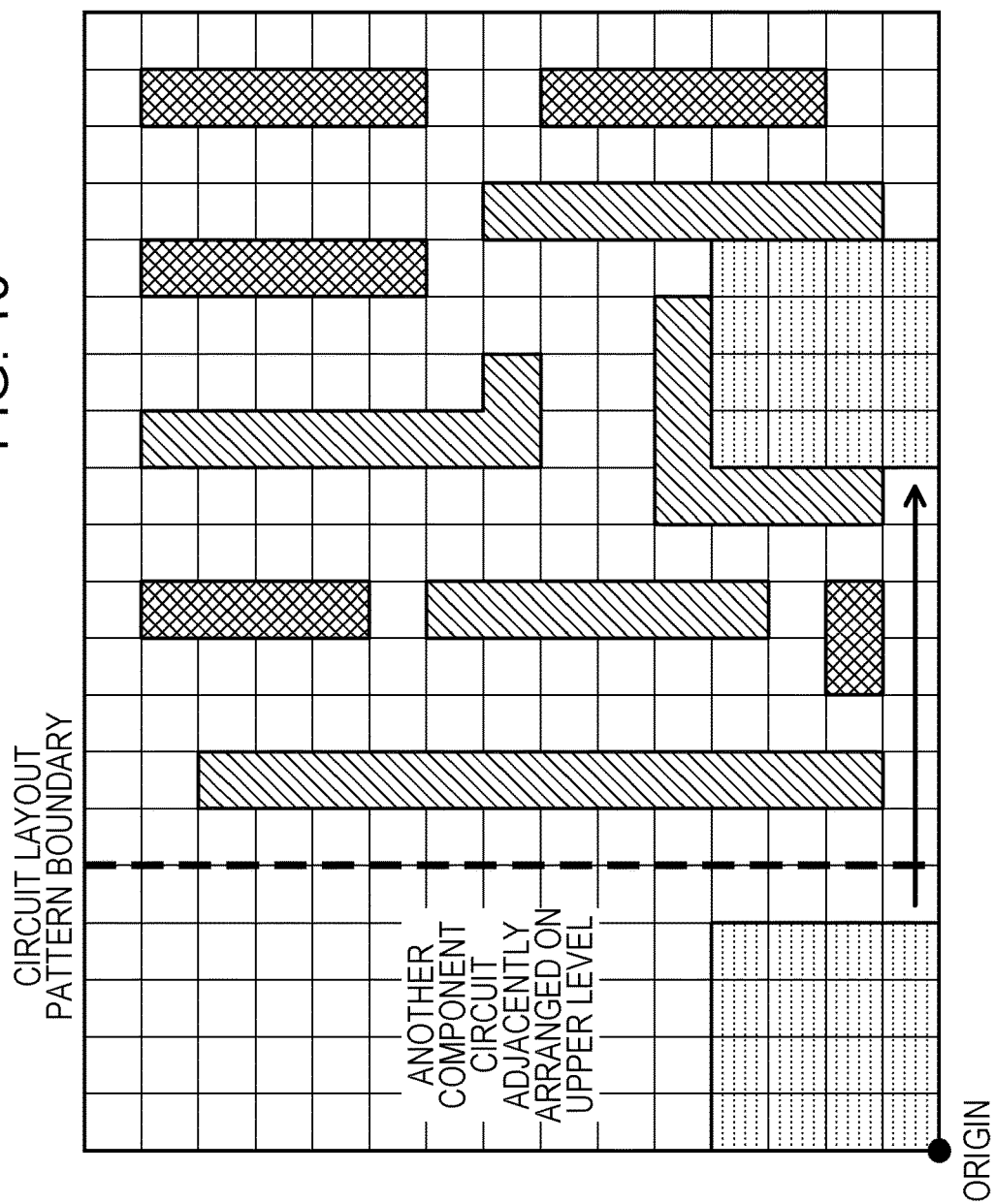
FIG. 10 is a diagram for describing exemplary detection of a density error on an upper level.

FIG. 10 is a diagram for describing an example in which a density error is detected on an upper level. FIG. 10 illustrates an example in which a layout operation on the upper level is performed by using the layout pattern of a component circuit which is illustrated in FIG. 9.

In the example in FIG. 10, the layout pattern of another component circuit is disposed on the left side of the layout pattern of the component circuit illustrated in FIG. 9. The origin on the upper level is used as the origin of the layout area on the upper level. Therefore, the origin on the upper level is different from the origin of the layout pattern of the component circuit illustrated in FIG. 9. On the upper level, when a density error determination operation is performed by using the window size and the amount of window movement which are described above, the check window matches the area A in which it has not been determined that a density error is detected on the lower level. Therefore, it is determined that a density error is detected in the area A. Thus, a change of the origin may cause a new density error to be detected on an upper level.

Exemplary Hardware Configuration of the Design Support Apparatus 100

Figure 11:
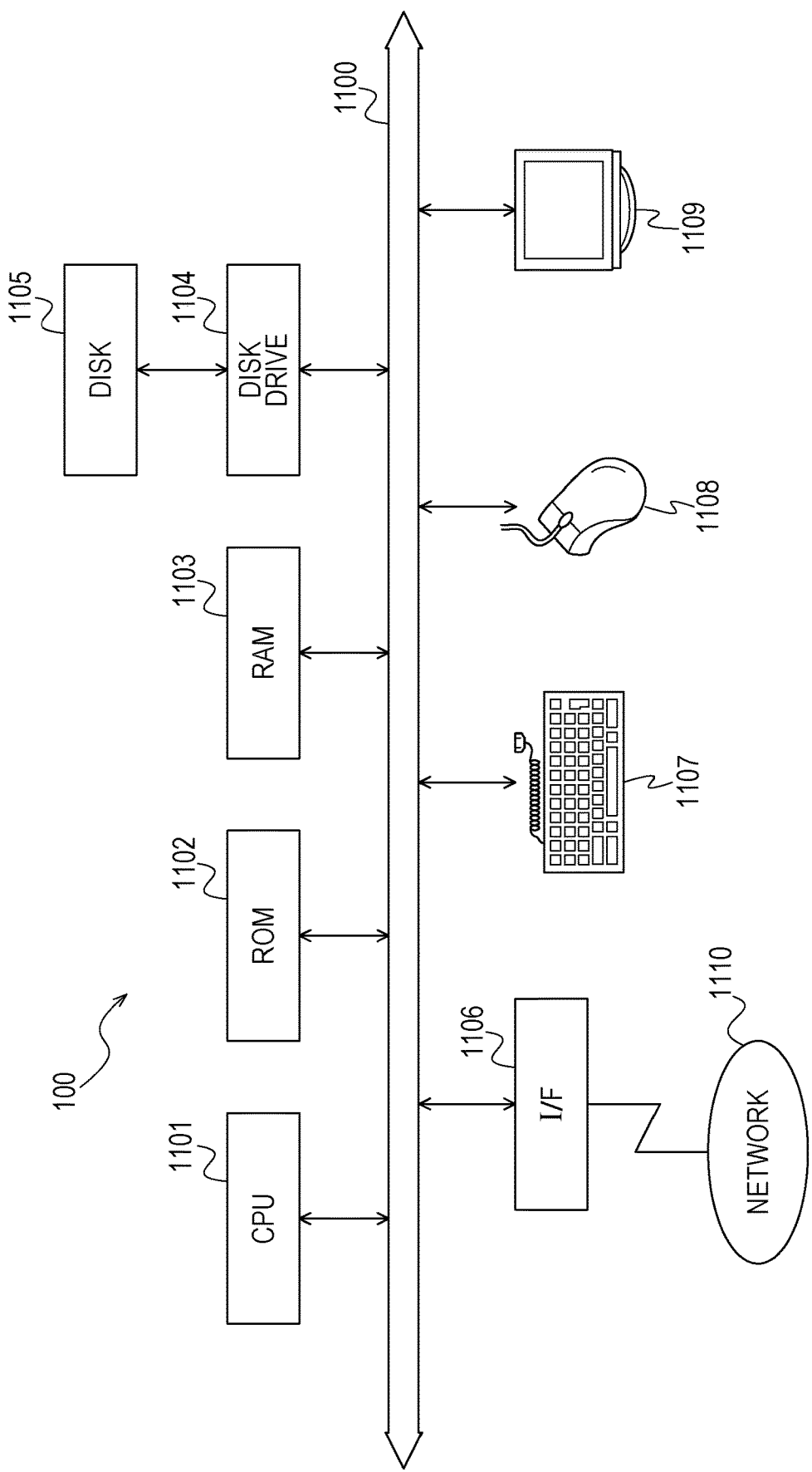
FIG. 11 is a block diagram illustrating an exemplary hardware configuration of a design support apparatus according to the embodiment.

FIG. 11 is a block diagram illustrating an exemplary hardware configuration of a design support apparatus according to the embodiment. The design support apparatus 100 includes a central processing unit (CPU) 1101, a ROM 1102, a RAM 1103, a disk drive 1104, and a disk 1105. The design support apparatus 100 includes an interface (I/F) 1106, a keyboard 1107, a mouse 1108, and a display 1109. The CPU 1101, the ROM 1102, the RAM 1103, the disk drive 1104, the I/F 1106, the keyboard 1107, the mouse 1108, and the display 1109 are connected to one another through a bus 1100.

The CPU 1101 controls the entire design support apparatus 100. The ROM 1102 stores programs such as a boot program. The RAM 1103 is used as a work area of the CPU 1101. The disk drive 1104 controls read/write of data on the disk 1105 in accordance with control of the CPU 1101. The disk 1105 stores data written through control of the disk drive 1104. Examples of the disk 1105 include a magnetic disk and an optical disk.

The I/F 1106 is connected, through a communication line, to a network 1110, such as a local area network (LAN), a wide area network (WAN), and the Internet, and is connected to other apparatuses through the network 1110. The I/F 1106 is responsible for interfacing inside units and the network 1110, and controls input/output of data from/to an external apparatus. As the I/F 1106, for example, a modem or a LAN adaptor may be used.

The keyboard 1107 and the mouse 1108 are interfaces for receiving input of various data through user operations. The display 1109 is an interface for outputting data through an instruction from the CPU 1101.

The design support apparatus 100 may be provided with an input device that captures an image or a moving picture from a camera, and an input device that captures sound from a microphone (not illustrated). The design support apparatus 100 may be provided with an output device such as a printer (not illustrated).

In the present embodiment, a personal computer is taken as an example of the hardware configuration of the design support apparatus 100. This is not limiting, and a server may be used. When the design support apparatus 100 is a server, the design support apparatus 100 may be connected to an apparatus, the display 1109, and the like, which may be operated by a user, through the network 1110.

Information Stored in Various DBs and the Like

Information stored in various databases (DBs) and the like included in the design support apparatus 100 will be described. The various DBs and the like are implemented, for example, by using storage units, such as the RAM 1103, the ROM 1102, the disk 1105, and a nonvolatile semiconductor memory, for example, a flash memory (not illustrated), which are included in the design support apparatus 100 illustrated in FIG. 11.

Exemplary storage of a setting value file and a target density ratio list which are used to generate, for each component circuit, multiple dummy patterns having different density ratios will be described by using FIGS. 12 and 13. By using FIG. 14, an exemplary circuit library 400 will be described.

Figure 12:
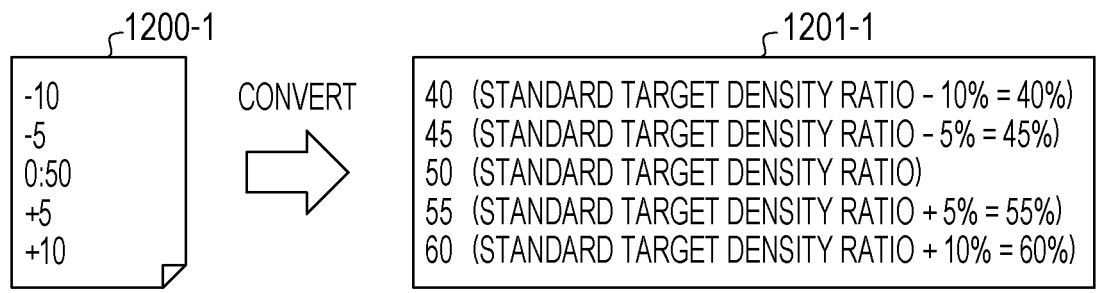
FIG. 12 is a diagram for describing first exemplary storage of a setting value file and a target density ratio list.

FIG. 12 is a diagram for describing first exemplary storage of a setting value file and a target density ratio list. A setting value file 1200-1 is a file for setting density ratios for generating, for each component circuit, multiple dummy patterns having different density ratios. The setting value file 1200-1 describes increase or decrease rates by using the standard density ratio as the reference (0%). The standard density ratio is a density ratio used as the reference in generation of dummy patterns. The standard density ratio is determined, for example, based on the limit range stipulated in the density rule. A circuit pattern of a component circuit is generated so that the standard density ratio is satisfied. In the example of the setting value file 1200-1 in FIG. 12, the standard density ratio is expressed in a form such as "0:50" ("the increase or decrease rate: the density ratio").

A target density ratio list 1201-1 is a file in which target density ratios generated based on the setting value file 1200-1 are described. Specifically, the target density ratio list 1201-1 is, for example, a file having a list of target density ratios obtained by adding the standard density ratio to each increase or decrease value described in the setting value file 1200-1. For example, a target density ratio "45%" is obtained through the standard density ratio of 50% minus 5%. In the example in FIG. 12, the target density ratios are values having equal intervals of 5%. This is not limiting. The intervals between the target density ratios is not necessarily equal.

Figure 13:
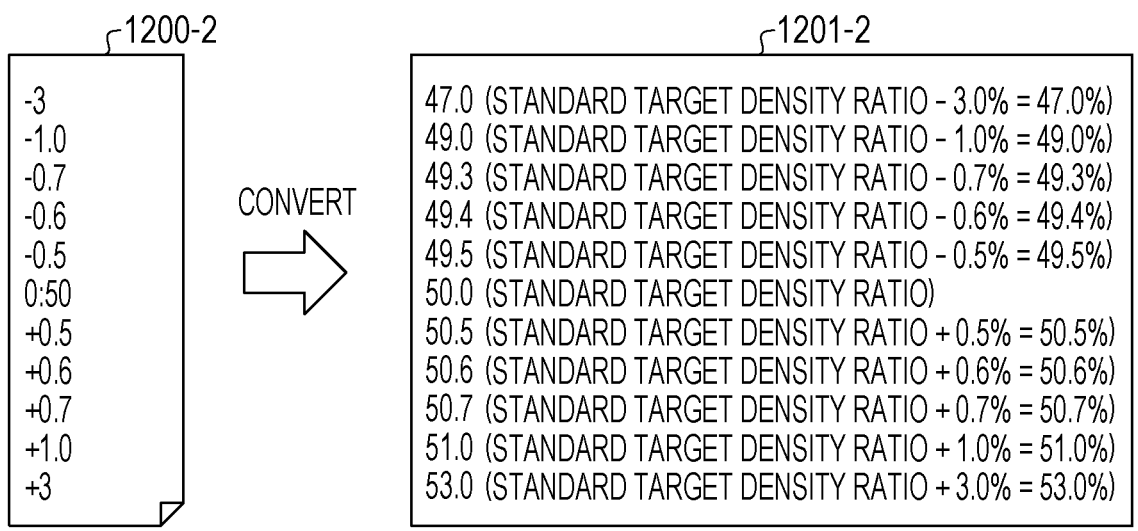
FIG. 13 is a diagram for describing second exemplary storage of a setting value file and a target density ratio list.

FIG. 13 is a diagram for describing second exemplary storage of a setting value file and a target density ratio list. A setting value file 1200-2 illustrated in FIG. 13 is a file for setting target density ratios so that the number of dummy patterns for which the density ratios are close to the standard density ratio is large and the number of dummy patterns for which the density ratios are far from the standard density ratio is small. A target density ratio list 1201-2 illustrated in FIG. 13 is a file having a list of target density ratios generated based on the setting value file 1200-2 illustrated in FIG. 13. The intervals between target density ratios close to the standard density ratio are set in decrements/increments of 0.1%, such as 49.5%, 49.4%, and 49.3%. In contrast, the intervals between target density ratios far from the standard density ratio are set so as to be larger than the intervals between the target density ratios close to the standard density ratio, such as 49.0% and 47.0%.

In the present embodiment, the same setting value file 1200 is used for all of the component circuits. Therefore, layout patterns substantially for the same set of density ratios are generated for all of the component circuits. However, this is not limiting. For example, a setting value file 1200 may be prepared for each component circuit, and any way may be employed.

Figure 14:
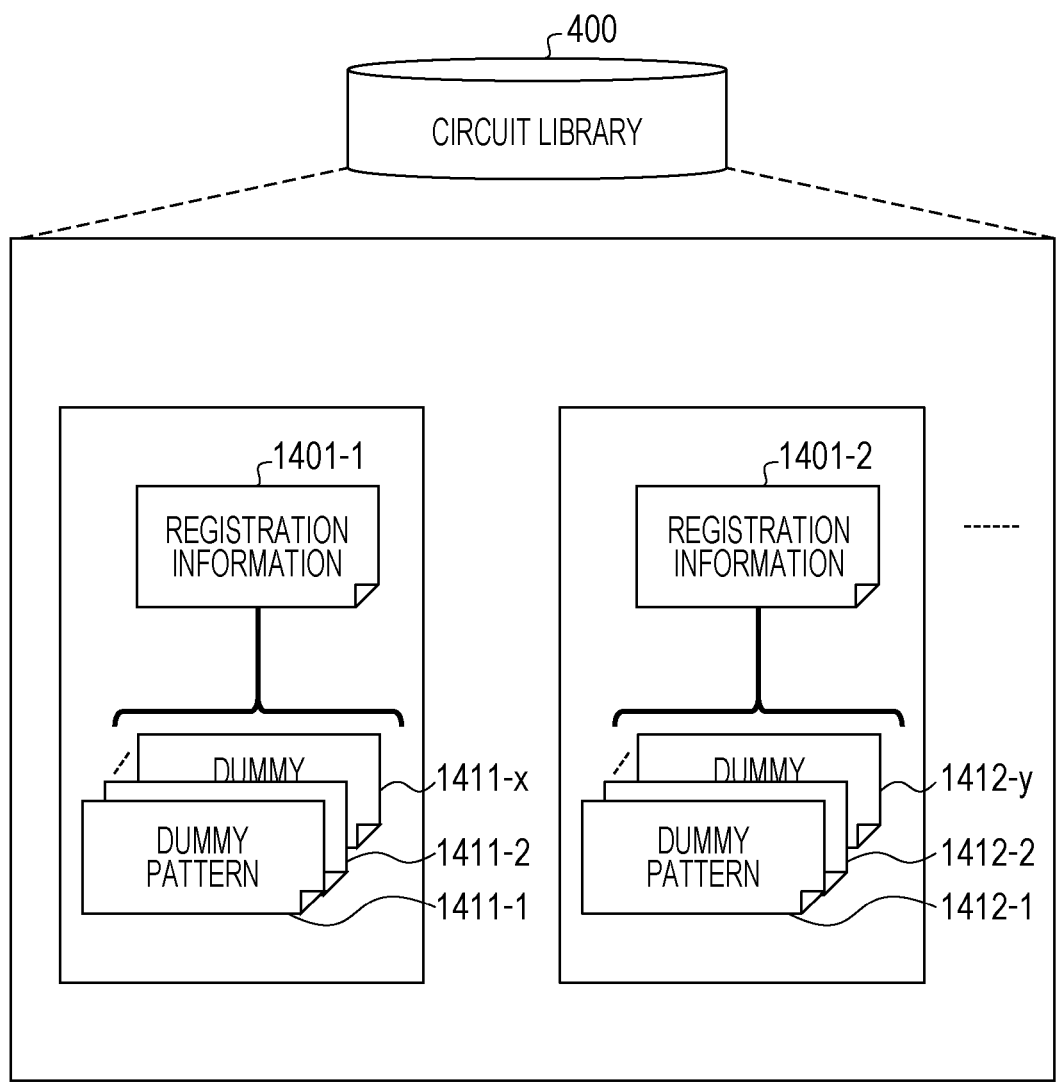
FIG. 14 is a diagram for describing exemplary storage of a circuit library.

FIG. 14 is a diagram for describing exemplary storage of a circuit library. In the circuit library 400, for example, registration information 1401 and pattern data 141n-m indicating multiple dummy patterns associated with the registration information 1401 are registered for each component circuit type.

In this example, component circuits having the same function and the same performance are regarded as the same type, and component circuits having different functions or different performances are regarded as different types. Even when the functions are the same, component circuits having different circuit patterns are regarded as different types. For example, a 2-input, 1-output OR cell having a drive capability of 1 and a 2-input, 1-output OR cell having a drive capability of 2 are different types of component circuits.

The symbol n represents an integer of 1 or more. The symbol n is determined depending on the number of component circuit types. The symbol m is determined depending on the number of registered dummy patterns, such as 1 to x or 1 to y.

FIG. 15 is a diagram for describing first exemplary storage of registration information. Registration information 1401-A is, for example, information in which density ratios are associated with pattern data indicating dummy patterns obtained through layout operations so that the density ratios are satisfied. The registration information 1401-A illustrated in FIG. 15 is, for example, registration information obtained when pattern data is generated based on the setting value file 1200-1 illustrated in FIG. 12.

The registration information 1401-A includes fields of the density ratio, the data ID, and the pattern data name. In the density ratio field, an increase or decrease value by which the target density ratio is to be increased or decreased from the standard density ratio is set. In the data ID field, identification information of a dummy pattern obtained through a layout operation so that the target density ratio is satisfied is set. As identification information of a dummy pattern, the top drawing name of the dummy pattern designed by using layout computer-aided design (CAD) is set. In the pattern data name field, the location of the file of the pattern data indicating the dummy pattern is set.

FIG. 16 is a diagram for describing second exemplary storage of registration information. For example, registration information 1401-B illustrated in FIG. 16 is registration information 1401 obtained when pattern data is generated based on the setting value file 1200-2 illustrated in FIG. 13. The fields included in the registration information 1401-B illustrated in FIG. 16 are the same as those included in the registration information 1401-A illustrated in FIG. 15, and will not be described in detail.

In the registration information 1401 illustrated in FIGS. 15 and 16, pattern data is associated with density ratios. Thus, the design support apparatus 100 may search for pattern data corresponding to a specified density ratio.

FIG. 17 is a diagram for describing exemplary storage of an error list. An error list 1700 is a database in which information about errors produced by using the DRC tool is collected. The error list 1700 includes, for example, fields of the density rule name, the error type, the number of errors, the density limit, the error coordinates, the density ratio of the error area (error density ratio), and the difference between the limit and the error density ratio. Information is set in each field. Thus, error elements 1701-1 to 1701-6 and the like are stored as records.

In the density rule name field, a density rule name defined in the DRC rule is set. In the error type field, the type of the density rule is set. As the density rule type, one of the "high density error", the "low density error", and the "density difference error" is set.

In the number-of-errors field, the number of errors detected according to the density rule is set. In the density limit field, for example, a limit of the density ratio defined in the DRC rule is set. When the density rule type is the "high density error", the upper limit of the density ratio is set in the density limit field. When the density rule type is the "low density error", the lower limit of the density ratio is set in the density limit field. When the density rule type is the "density difference error", the upper limit and the lower limit of the density difference are set in the density limit field. For example, in the case of the density rule "density_01", the upper limit which is a density limit is 70%.

In the error coordinates field, the coordinates value of the layout coordinates of the area in which the error has been detected is set. In the layout area, the X axis and the Y axis which are orthogonal to each other are defined, and the origin is defined. Specifically, in the error coordinates field, as layout coordinates indicating an area, in which an error has been detected, of the layout area, for example, "{the X coordinate at the lower left corner of the rectangle, the Y coordinate at the lower left corner of the rectangle} {the X coordinate at the upper right corner of the rectangle, the Y coordinate at the upper right corner of the rectangle}" is set. For example, an error area detected according to the density rule "density_01" is an area represented by "{10, 10} {60, 60}".

In the error density ratio field, the density ratio of the error area detected by using the DRC tool is set. In the field of the difference between the limit and the error density ratio, the difference value between the limit and the error density ratio is set. For example, the density ratio of an error area detected according to the density rule "density_01" is "80", and the difference between the limit and the error density ratio is "10".

Exemplary Functional Configuration of the Design Support Apparatus 100

Figure 18:
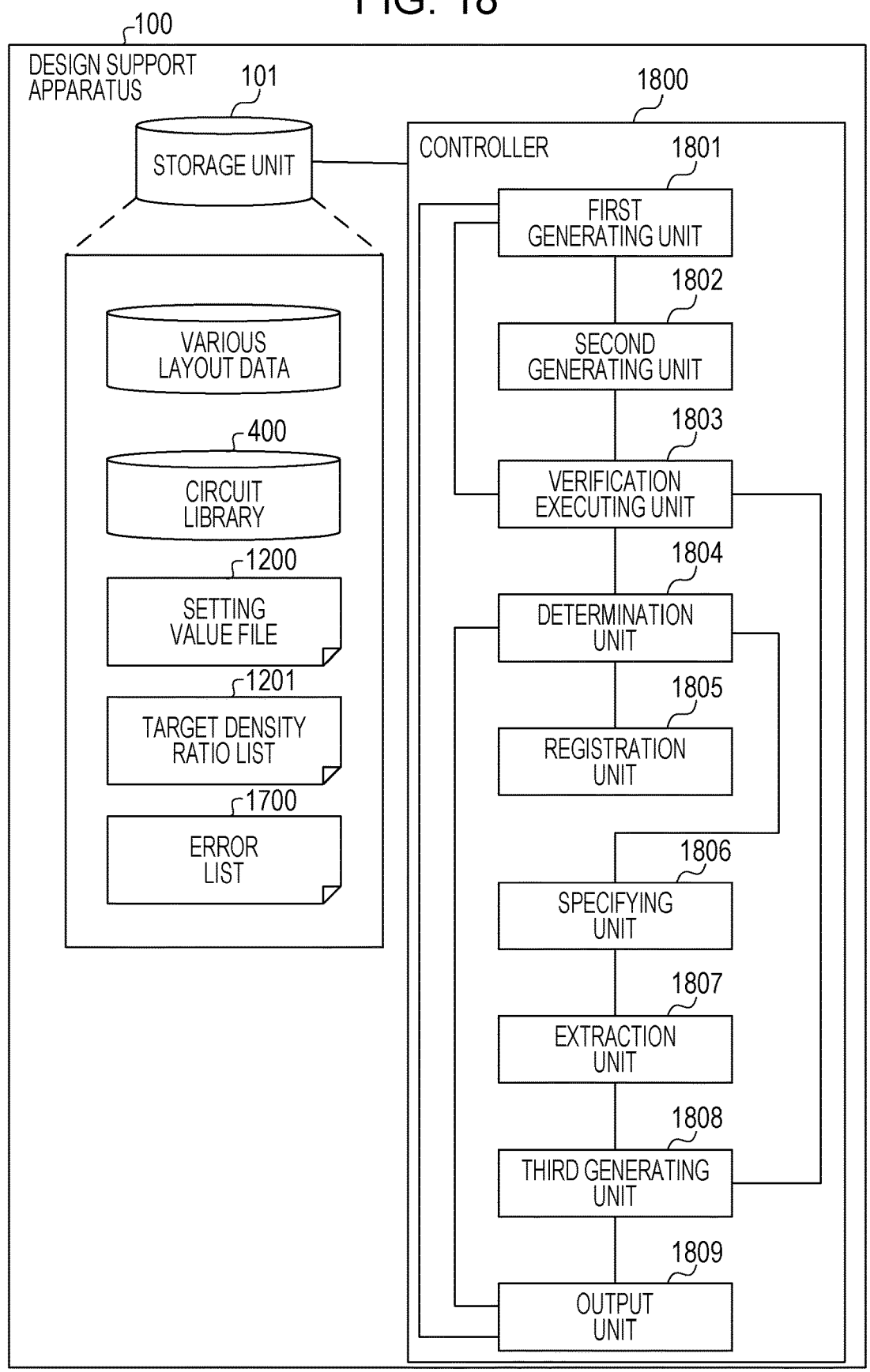
FIG. 18 is a block diagram illustrating an exemplary functional configuration of a design support apparatus.

FIG. 18 is a block diagram illustrating an exemplary functional configuration of a design support apparatus. The design support apparatus 100 includes a first generating unit 1801, a second generating unit 1802, a verification executing unit 1803, a determination unit 1804, a registration unit 1805, a specifying unit 1806, an extraction unit 1807, a third generating unit 1808, an output unit 1809, and the storage unit 101. The processes of a controller 1800 including the first generating unit 1801 to the output unit 1809 are, for example, coded in programs stored in storage devices, such as the ROM 1102, the RAM 1103, and the disk 1105, which may be accessed by the CPU 1101 illustrated in FIG. 11. The CPU 1101 reads the programs from the storage devices, and performs the processes coded in the programs. Thus, the processes of the controller 1800 are implemented.

The storage unit 101 is implemented by using the RAM 1103, the ROM 1102, the disk 1105, the semiconductor memory, and the like. The storage unit 101 stores, for example, various type of layout data, the circuit library 400, the setting value file 1200, the target density ratio list 1201, and the error list 1700. The processing results of the controller 1800 are stored, for example, in the storage devices, such as the RAM 1103, the ROM 1102, and the disk 1105.

For each of the functional blocks included in the controller 1800, a lower-level layout design operation will be described. Then, an upper-level layout design operation will be described in detail.

First, the lower-level layout design operations will be described.

For each of the component circuits included in a target circuit to be designed, the first generating unit 1801 generates layout data indicating the circuit pattern of the component circuit. In other words, the first generating unit 1801 performs a place and route process on each lower-level component circuit. More specifically, the first generating unit 1801 may perform a place and route process on component circuits, for example, by using an automatic place and route tool. Alternatively, the first generating unit 1801 may perform a place and route process on the component circuits, for example, in accordance with operation input from a designer on the keyboard 1107, the mouse 1108, and the like. For example, a component circuit, such as a standard cell and a macro cell, a block, and a sub-chip, is used multiple times at upper levels. Therefore, similarly to the related art, layout data of a component circuit is generated for each type.

For each of the component circuits, the second generating unit 1802 generates pattern data indicating a dummy pattern based on the layout data generated by the first generating unit 1801. Specifically, the second generating unit 1802 generates pattern data indicating a dummy pattern by providing the standard density ratio to the dummy generating tool. The standard density ratio is set, for example, to any value. For example, the standard density ratio may be set to an intermediate value of the limit range stipulated in the density rule. If the lower limit of the limit range is 30% and the upper limit of the limit range is 70%, the target density ratio is set to 50%. As described above, a dummy pattern for the standard density ratio is called a standard dummy pattern. The second generating unit 1802 merges the layout data generated by the first generating unit 1801 with the pattern data indicating the standard dummy pattern. As the merge process, the second generating unit 1802, for example, adds the pattern data to the layout data generated by the first generating unit 1801. The layout data of a component circuit satisfying the standard density ratio is obtained. Similarly to the related art, the pattern data is generated for each of the layout layers, such as the wiring pattern and the polysilicon pattern.

For each of the component circuits, the verification executing unit 1803 performs verifications, such as DRC, timing verification, power analysis, and noise analysis, on the layout data generated by the second generating unit 1802. Specifically, for example, the verification executing unit 1803 performs the verifications by providing the layout data generated by the second generating unit 1802 to verification tools for DRC, timing verification, power analysis, noise analysis, and the like. The verification tools may be operated on the design support apparatus 100, or may be operated on a different apparatus that may communicate with the design support apparatus 100. For example, when the verification tools are operated on the different apparatus which may communicate with the design support apparatus 100, the design support apparatus 100 notifies the different apparatus of an instruction to activate the verification tools by using the layout data as input. Thus, the verification executing unit 1803 may perform each of the verifications.

The determination unit 1804 determines whether or not the verification results obtained through the verifications performed by the verification executing unit 1803 satisfy the constraint. Specifically, for example, the determination unit 1804 determines whether or not errors have occurred in the verifications using the verification tools. Taking DRC as an example, it is determined whether or not the constraint in the density rule is satisfied, by using the DRC tool. Therefore, the determination unit 1804 determines whether or not the verification results include information indicating that a density error has occurred. If the determination unit 1804 determines that an error has occurred in any verification, the processes of the first generating unit 1801 are performed in order to modify the circuit layout pattern which does not include a dummy pattern. For example, the constraint in DRC is included in the above-described physical design rule. When all of the verification results of the multiple component circuits satisfy the constraint, dummy patterns for different densities are to be generated.

For each of the multiple component circuits, the second generating unit 1802 generates pattern data indicating dummy patterns having shapes different from that of the standard dummy pattern, based on the layout data generated by the first generating unit 1801. An example in which, in order to prepare dummy patterns having different shapes, a dummy pattern is generated for each target density ratio stipulated in the target density ratio list 1201 will be described. Specifically, for example, for each target density ratio stipulated in the target density ratio list 1201, the second generating unit 1802 generates pattern data corresponding to the target density ratio. For example, for each component circuit, the second generating unit 1802 merges the pattern data with the layout data generated by the first generating unit 1801, for every target density ratio. As described above, for example, the merge process is performed by adding the generated pattern data to the layout data generated by the first generating unit 1801. Pattern data for every target density ratio is generated for each layout layer, such as the wiring layer and the polysilicon layer.

For each of the multiple component circuits, the verification executing unit 1803 performs the verifications, such as DRC, timing verification, power analysis, and noise analysis, on the layout data generated by the second generating unit 1802 for each target density ratio. The verifications are performed by the verification executing unit 1803 as described above.

For each of the multiple component circuits, the determination unit 1804 determines whether or not the verification results satisfy the constraint for every target density ratio.

For each of the multiple component circuits, the registration unit 1805 registers a target density ratio, for which it has been determined that the verification results of the layout data satisfy the constraint, in association with the pattern data generated for the target density ratio, in the circuit library 400 stored in the storage unit 101. Specifically, the registration unit 1805 stores the pattern data in the storage unit 101, and registers, in the registration information 1401, the density ratio, the data ID, and the pattern data name in accordance with the type of the component circuit. The detailed examples of the registration information 1401 are illustrated in FIGS. 15 and 16 as described above.

An upper-level layout design operation will be described. The first generating unit 1801 generates first layout data indicating a circuit pattern of the target circuit. A circuit pattern of the target circuit includes the position of the circuit pattern of each of the multiple component circuits in the layout area of the target circuit, the position of the dummy pattern of each of the component circuits, and a wiring pattern which connects among the component circuits. For example, the first generating unit 1801 generates the first layout data based on the layout data of each component circuit.

Specifically, for example, the first generating unit 1801 may generate the first layout data by using a place and route tool. Alternatively, for example, the first generating unit 1801 may generate the first layout data in accordance with operation input from a designer on input devices, such as the mouse 1108 and the keyboard 1107. The second generating unit 1802 may generate pattern data indicating a dummy pattern so that the standard density ratio is obtained for the circuit pattern of the target circuit indicated by the first layout data. The second generating unit 1802 merges the first layout data with the generated pattern data.

The verification executing unit 1803 performs the verifications, such as DRC, timing verification, power analysis, and noise analysis, on the first layout data.

The determination unit 1804 determines whether or not the verification results of the first layout data satisfy the constraint. If the verification results for timing verification, power analysis, noise analysis, and the like do not satisfy the constraint, the wiring pattern or the like is modified. In addition, for example, if the determination unit 1804 analyzes the verification results from the DRC tool and if the verification results from the DRC tool include a density error, the determination unit 1804 generates the error list 1700. An exemplary error list 1700 is illustrated in FIG. 17 as described above.

Among the multiple component circuits included in the target circuit, the specifying unit 1806 specifies, in the first layout data, a component circuit included in an area, in which the density of the circuit pattern of the target circuit does not satisfy the constraint, of the arrangement area. This area indicates an area which matches a check window as described above and in which a density error has been detected. An area in which a density error has been detected is also called an error area. Specifically, for example, the specifying unit 1806 obtains an error element at the top of the error list 1700. Among the component circuits, the specifying unit 1806 specifies a component circuit included in the error area based on the error coordinates included in the obtained error element.

A specified component circuit may be a component circuit, at least a part or the entirety of which is included in an error area, or may be a component circuit, a given percentage of which is included in the error area. Thus, a condition with a component circuit is specified may be determined by a designer or a developer of the design support apparatus 100, and is not particularly limiting.

A component circuit specified by the specifying unit 1806 is also called a replacement candidate circuit. For example, the specifying unit 1806 generates a hierarchical-level name list obtained by listing, as elements, names, such as the instance names of replacement candidate circuits.

The extraction unit 1807 extracts, from the storage unit 101, pattern data indicating a dummy pattern of the specified component circuit which corresponds to a density different from that of the dummy pattern of the component circuit specified by the specifying unit 1806 in the arrangement area. Specifically, for example, the extraction unit 1807 extracts an element at the top of the hierarchical-level name list. Then, for example, the extraction unit 1807 extracts, from the circuit library 400, pattern data for a density ratio different from that of the pattern data of the replacement candidate circuit which is included in the first layout data and which is indicated by the extracted element.

The pattern data to be extracted is determined, for example, in accordance with the type of a density error. As described above, there are three density error types, the "high density error", the "low density error", and the "density difference error".

A case where the error type is the "high density error" will be described. As described above, in the case where the error type is the "high density error", the density ratio of the error area is higher than the density range stipulated in the density rule. Therefore, the extraction unit 1807 extracts pattern data so that the density ratio of the error area is decreased. Specifically, for example, the extraction unit 1807 extracts, from the circuit library 400, pattern data indicating a dummy pattern for a lower density ratio than the density ratio for the dummy pattern of the replacement candidate circuit included in the first layout data.

A case where the error type is the "low density error" will be described. As described above, in the case where the error type is the "low density error", the density ratio of the error area is lower than the density range stipulated in the density rule. Therefore, the extraction unit 1807 extracts pattern data so that the density ratio of the error area is increased. Specifically, for example, the extraction unit 1807 extracts, from the circuit library 400, pattern data indicating a dummy pattern for a higher density ratio than the density ratio for the dummy pattern of the component circuit included in the first layout data.

A case where the error type is the "density difference error" will be described. In the density difference rule, a density difference is stipulated. In DRC using the density difference rule, in the case where the density ratio of a certain area is larger than the density ratio of a first area of two areas adjacent to the certain area with the difference more than the stipulated density difference, and where the density ratio of the certain area is smaller than the density ratio of a second area of the two areas adjacent to the certain area with the difference more than the stipulated density difference, the two areas are detected as error areas. The first area having a low density ratio is called a low density error area. The second area having a high density ratio is called a high density error area.

Thus, when the error type is the "density difference error", two areas are detected as error areas. The extraction unit 1807 extracts pattern data of the replacement candidate circuit in each of the low density error area and the high density error area so that the density difference between the certain area and the low density error area and the density difference between the certain area and the high density error area are equal to or less than the stipulated density difference. Any method may be employed as long as the density difference error is cleared. For example, the extraction unit 1807 may extract pattern data of the replacement circuit in one of the low density error area and the high density error area. In the case of the low density error area, the extraction unit 1807 extracts pattern data indicating a dummy pattern for a higher density ratio than the density ratio for the dummy pattern of the replacement candidate circuit in the first layout data. In the case of the high density error area, the extraction unit 1807 extracts pattern data indicating a dummy pattern for a lower density ratio than the density ratio for the dummy pattern of the replacement candidate circuit in the first layout data.

The pattern data extracted by the extraction unit 1807 is also called fill-in candidate data. The dummy pattern indicated by fill-in candidate data is also called a fill-in candidate dummy pattern.

The third generating unit 1808 generates second layout data based on the first layout data and the fill-in candidate data. The second layout data indicates the circuit pattern of the target circuit in which the dummy pattern of the specified component circuit in the arrangement area is replaced with the dummy pattern of the fill-in candidate data. Specifically, the third generating unit 1808 replaces pattern data indicating the dummy pattern of the replacement candidate circuit included in the first layout data, with the fill-in candidate data. The first layout data after replacement serves as the second layout data. In the replacement process, the third generating unit 1808 deletes the pattern data indicating the dummy pattern of the replacement candidate circuit included in the first layout data. Then, the third generating unit 1808 merges the fill-in candidate data with the layout data of the replacement candidate circuit included in the first layout data. Thus, the existing pattern data may be replaced with the fill-in candidate data.

The verification executing unit 1803 performs DRC on the second layout data. The determination unit 1804 determines whether or not the verification results for DRC obtained by the verification executing unit 1803 performing verification on the second layout data satisfy the constraint.

If it is determined that the DRC verification results obtained by the verification executing unit 1803 performing verification on the second layout data satisfy the constraint, the output unit 1809 outputs the second layout data. Specifically, for example, the output unit 1809 stores the second layout data in the storage unit 101. Alternatively, for example, the output unit 1809 may display the circuit pattern indicated by the second layout data, as the circuit pattern of the target circuit by using layout CAD on a display device such as the display 1109.

A case where it is determined that the verification results obtained by the verification executing unit 1803 performing verification on the second layout data do not satisfy the constraint will be described.

The extraction unit 1807 may extract multiple pieces of pattern data. In this case, the third generating unit 1808 replaces the fill-in candidate data for the replacement candidate circuit included in the first layout data, with fill-in candidate data that has not been processed among the multiple pieces of fill-in candidate data, and generates new second layout data. As described above, the verification executing unit 1803 performs the verifications on the newly generated second layout data. Thus, in the case of multiple pieces of fill-in candidate data, until the determination unit 1804 determines that the verification results satisfy the constraint, the processes performed by the third generating unit 1808 and the verification executing unit 1803 may be repeatedly performed.

The specifying unit 1806 may extract multiple component circuits included in an error area. In this case, the extraction unit 1807 extracts pattern data for a density ratio different from the density ratio for the pattern data of a replacement candidate circuit that has not been processed among the multiple replacement candidate circuits. Then, the processes performed by the third generating unit 1808 and the verification executing unit 1803 are performed again. Thus, in the case where multiple replacement candidate circuits are present, until the determination unit 1804 determines that the verification results satisfy the constraint, the processes performed by the extraction unit 1807, the third generating unit 1808, and the verification executing unit 1803 may be repeatedly performed.

A developer, a designer, or the like of the design support apparatus 100 may optionally determine which is to be first changed, the replacement candidate circuits to be processed or the fill-in candidate data to be processed. This is not particularly limiting.

Even when both the replacement candidate circuits to be processed and the fill-in candidate data to be processed are sequentially changed, the determination unit 1804 may determine that the verification results do not satisfy the constraint. In this case, it is difficult to satisfy the density rule only with an increase or decrease of the density ratio obtained by changing the dummy pattern. Therefore, the output unit 1809 displays a message including information describing that the density error is not cleared only with a change of the dummy pattern, on a display device such as the display 1109. Thus, the design support apparatus 100 may provide an instruction to redesign the circuit layout itself of the target circuit.

In the description above about processes using a lower level and an upper level, two hierarchical levels are used. However, this is not limiting. For example, if the sub-chip level serves as an upper level, multiple hierarchical levels, such as the block level and the standard/macro cell level, may serve as lower levels. In this case, the specifying unit 1806 specifies a component circuit included in an error area for each hierarchical level. In generation of the above-described hierarchical-level name list, the specifying unit 1806 may list names, such as the instance names of replacement candidate circuits, for each hierarchical level.

A key for determining the order in which the elements are listed when the specifying unit 1806 generates the hierarchical-level name list may be selected. For example, when a change in density ratio in the first layout data is to be made small, the specifying unit 1806 may generate the hierarchical-level name list so that the dummy pattern of a lower-level replacement candidate circuit having a smaller area is preferentially changed. Specifically, for example, the specifying unit 1806 generates a hierarchical-level name list by arranging the names of lower-level replacement candidate circuits in ascending order of area. Thus, if there are lower-level circuits that are to be preferentially processed, the specifying unit 1806 generates a hierarchical-level name list by first arranging the names of the lower-level replacement candidate circuits sequentially.

Replacement candidate circuits to be processed by the extraction unit 1807 and the third generating unit 1808 may be determined for each hierarchical level, or may be determined at different hierarchical levels. This is not particularly limiting.

When the violation value of a density error is very small, the error may be cleared only with a slight change in the shape of a dummy pattern. Therefore, if a dummy pattern that is generated for the same density ratio and that has a different shape is present, the probability of clearing the error is increased. Therefore, for example, multiple dummy generating tools using different processing algorithms are prepared. The second generating unit 1802 generates pattern data indicating a dummy pattern for the standard density ratio, by using a first dummy generating tool among the multiple dummy generating tools. The second generating unit 1802 generates pattern data indicating a dummy pattern for the standard density ratio by using a different dummy generating tool other than the first dummy generating tool. The registration unit 1805 may register, in the circuit library 400, the pattern data generated by using the different dummy generating tool, as pattern data of a dummy pattern having a different shape. For each of the multiple dummy generating tools, the second generating unit 1802 may generate pattern data indicating a dummy pattern for a target density ratio. The registration unit 1805 may register, in the circuit library 400, the identification information of the dummy generating tool, the target density ratio, and the pattern data in association with one another.

Exemplary Procedure Performed by the Design Support Apparatus 100

A procedure performed by the design support apparatus 100 will be described. A lower-level design procedure will be described by using FIGS. 19 and 20. A design procedure performed when a density error occurs in DRC in upper-level design will be described by using FIGS. 21 and 22.

Figure 19:
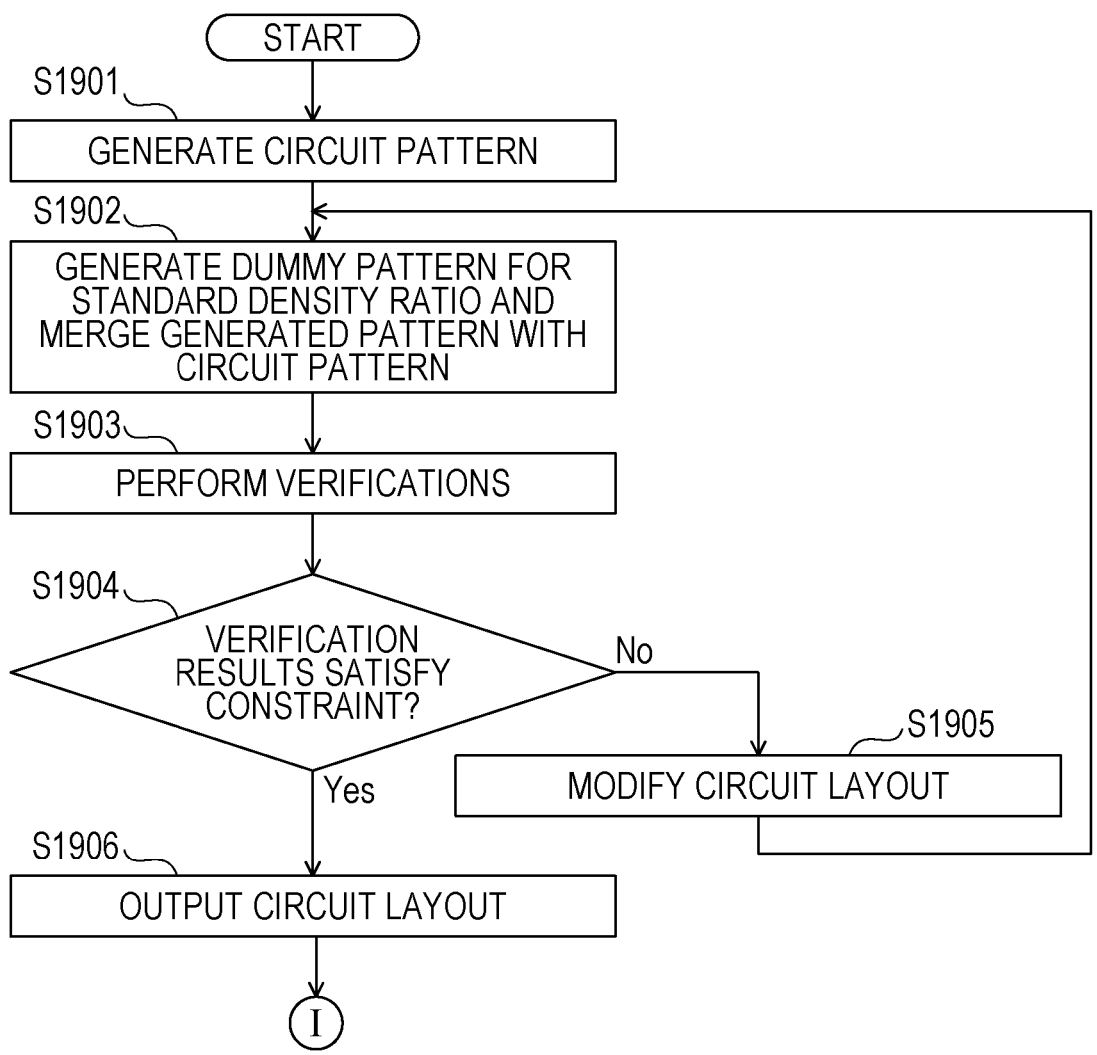
FIG. 19 is a flowchart of the first exemplary lower-level design procedure performed by a design support apparatus.
Figure 20:
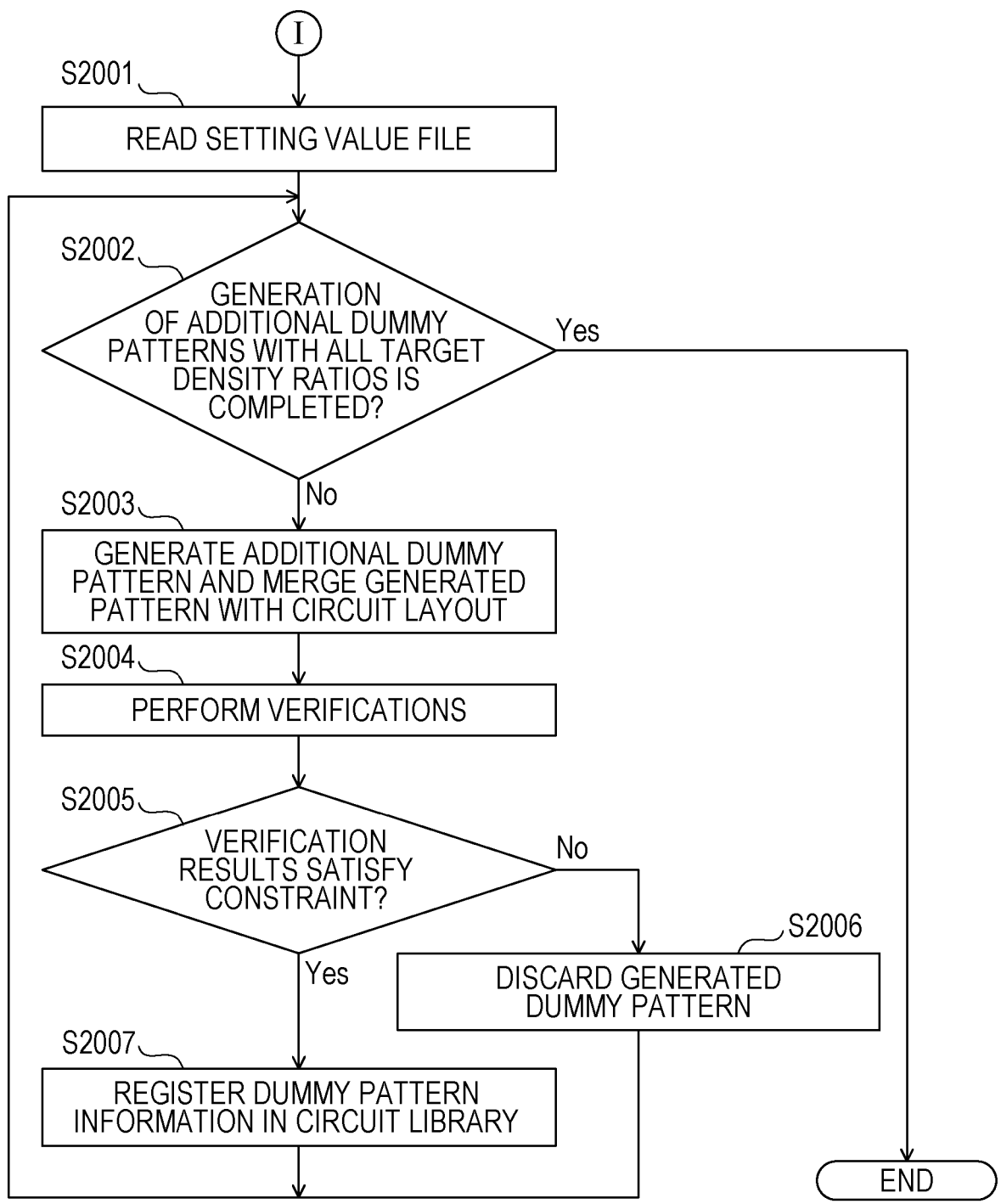
FIG. 20 is a flowchart of the second exemplary lower-level design procedure performed by a design support apparatus.

FIGS. 19 and 20 are flowcharts of an exemplary lower-level design procedure performed by a design support apparatus. The design support apparatus 100 generates a circuit pattern of a lower-level component circuit (step S1901). Generation of a circuit pattern indicates generation of layout data indicating a circuit pattern of the component circuit.

Then, the design support apparatus 100 generates a dummy pattern for the standard density ratio, and merges the generated dummy pattern with the circuit pattern (step S1902). In step S1902, layout data indicating a layout pattern of the component circuit is obtained. The design support apparatus 100 performs the verifications, such as DRC, timing verification, power analysis, and noise analysis, on the layout data indicating the layout pattern obtained through the merge operation (step S1903).

The design support apparatus 100 determines whether or not the verification results satisfy the constraint (step S1904). If it is determined that the verification results do not satisfy the constraint (No in step S1904), the design support apparatus 100 modifies the circuit layout (step S1905). Modification of a circuit layout indicates modification of layout data indicating a layout pattern of the component circuit. If it is determined that the verification results satisfy the constraint (Yes in step S1904), the design support apparatus 100 outputs the circuit layout (step S1906). Output of a circuit layout indicates output of layout data indicating a layout pattern of the component circuit. In step S1906, for example, the design support apparatus 100 stores the layout data in the storage unit 101 or the like. After step S1906, the design support apparatus 100 proceeds the process to step S2001 illustrated in FIG. 20.

The design support apparatus 100 reads the setting value file 1200 (step S2001). In step S2001, the design support apparatus 100 may generate the target density ratio list 1201 based on the setting value file 1200 having been read and the standard density ratio.

It is determined whether or not generation of additional dummy patterns for all of the target density ratios included in the target density ratio list 1201 has been completed (step S2002). If it is determined that generation of additional dummy patterns for all of the target density ratios has not been completed (No in step S2002), the design support apparatus 100 generates an additional dummy pattern based on a target density ratio that has not been processed among the target density ratios included in the target density ratio list 1201, and merges the generated pattern with the circuit layout (step S2003). The circuit layout indicates the circuit layout which has not been merged with the dummy pattern and which is generated in step S1901 or step S1905 illustrated in FIG. 19.

The design support apparatus 100 performs the various verifications on the layout data indicating the circuit layout obtained through the merge operation (step S2004). Then, the design support apparatus 100 determines whether or not the verification results satisfy the constraint (step S2005). If it is determined that the verification results do not satisfy the constraint (No in step S2005), the design support apparatus 100 discards the generated dummy pattern (step S2006), and returns the process to step S2002. If it is determined that the verification result satisfy the constraint (Yes in step S2005), the design support apparatus 100 registers information about the dummy pattern in the circuit library 400 (step S2007), and returns the process to step S2002. In step S2007, registration of information about a dummy pattern in the circuit library 400 indicates registration of the target density ratio and pattern data indicating the generated dummy pattern in association with each other in the circuit library 400.

In step S2002, if it is determined that generation of additional dummy patterns for all of the target density ratios has been completed (Yes in step S2002), the design support apparatus 100 ends the series of processes.

The processes illustrated in FIGS. 19 and 20 are performed on a single lower-level component circuit. Similar processes are performed for each component circuit type.

Figure 21:
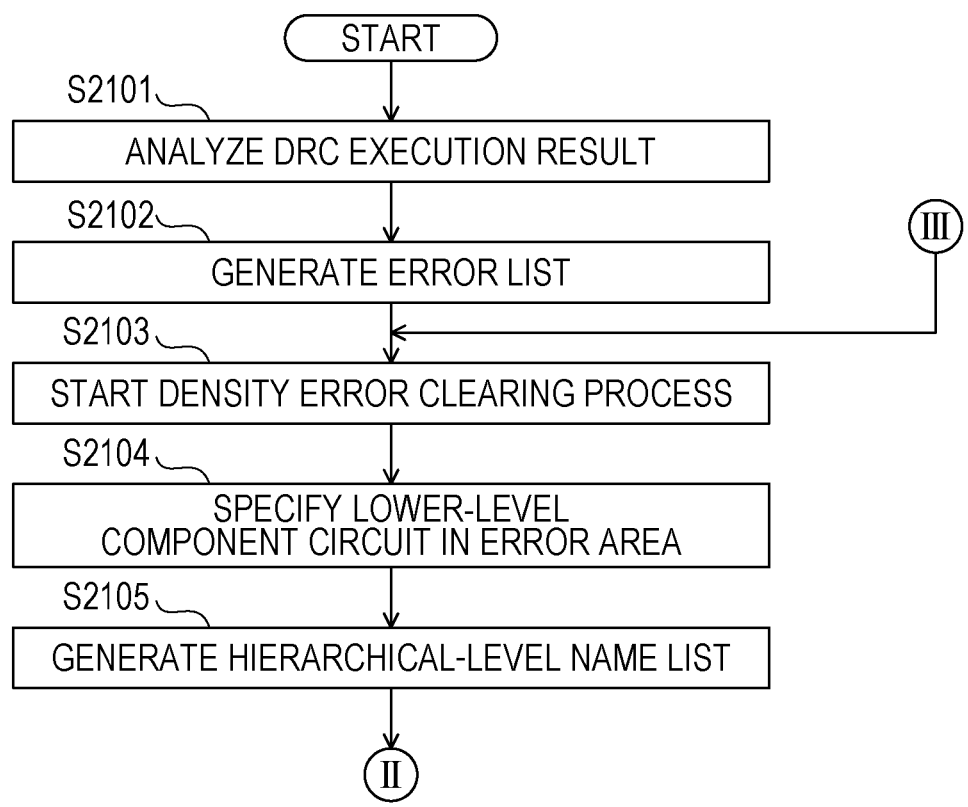
FIG. 21 is a flowchart of the first exemplary design procedure performed by a design support apparatus when a density error occurs on an upper level.
Figure 22:
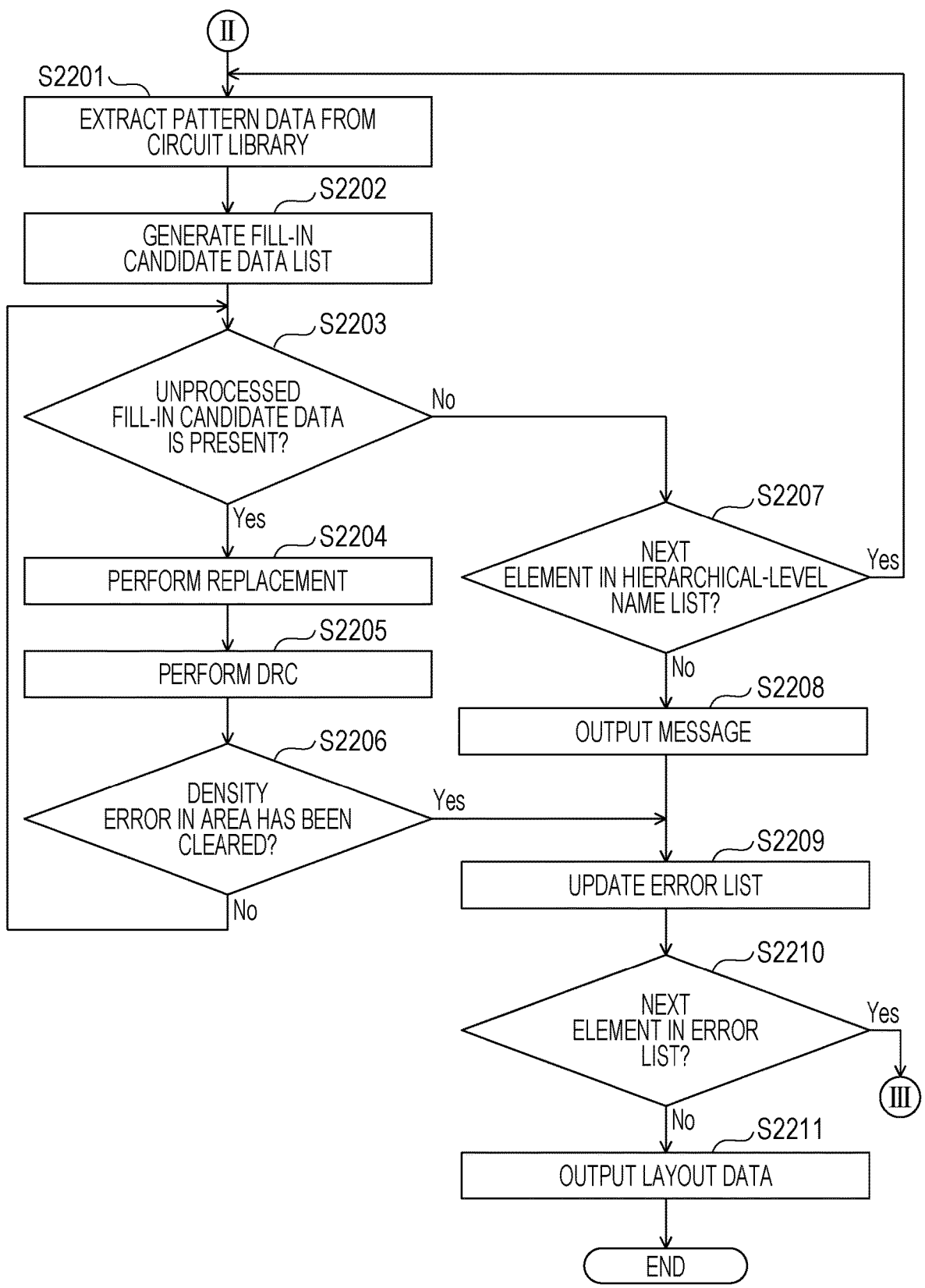
FIG. 22 is a flowchart of the second exemplary design procedure performed by a design support apparatus when a density error occurs on an upper level.

FIGS. 21 and 22 are flowcharts of an exemplary design procedure performed by a design support apparatus when a density error occurs on an upper level. A process performed after a density error occurs in DRC verification performed on the first layout data obtained in upper-level design will be described. The description will be made under the assumption that an error other than a density error does not particularly occur.

The design support apparatus 100 analyzes DRC execution results (step S2101). In step S2101, the design support apparatus 100 collects information about the type of density errors, the number of errors, the density limit of the rule with which the errors have been detected, the circuit layout coordinates of the error areas, the density ratios of the error areas, the differences between the density limit and the density ratios of the error areas, and the like, from the DRC execution results.

The design support apparatus 100 generates the error list 1700 based on the analysis result (step S2102). The design support apparatus 100 starts a density error clearing process (step S2103). In step S2103, the design support apparatus 100 extracts an element which has not been processed, from the top of the error list 1700. The element is a record or the like.

The design support apparatus 100 specifies a lower-level component circuit which is included in the error area included in the extracted element (step S2104). The design support apparatus 100 generates a hierarchical-level name list (step S2105), and proceeds the process to step S2201.

The design support apparatus 100 extracts pattern data from the circuit library 400 (step S2201). The design support apparatus 100 generates a list of dummy patterns for pieces of fill-in candidate data (step S2202). In step S2202, for example, the design support apparatus 100 may list the names of the pieces of fill-in candidate data.

The design support apparatus 100 determines whether or not an unprocessed piece of fill-in candidate data is present in the generated list (step S2203). If it is determined that an unprocessed piece of fill-in candidate data is present (Yes in step S2203), the design support apparatus 100 replaces the dummy pattern based on one of the unprocessed pieces of fill-in candidate data (step S2204). In step S2204, the design support apparatus 100 generates the second layout data obtained by replacing the dummy pattern of a replacement candidate circuit included in the first layout data, with the dummy pattern indicated by the piece of fill-in candidate data.

The design support apparatus 100 performs DRC (step S2205). The design support apparatus 100 determines whether or not the density error in the error area has been cleared (step S2206). If it is determined that the density error in the error area has not been cleared (No in step S2206), the design support apparatus 100 returns the process to the step S2203. If it is determined that the density error in the error area has been cleared (Yes in step S2206), the design support apparatus 100 proceeds the process to step S2209.

In step S2203, if it is determined that all of the pieces of fill-in candidate data have been processed (No in step S2203), the design support apparatus 100 determines whether or not a next element is present in the hierarchical-level name list (step S2207). If it is determined that a next element is present in the hierarchical-level name list (Yes in step S2207), the design support apparatus 100 returns the process to step S2201.

If it is determined that a next element is not present (No in step S2207), the design support apparatus 100 outputs a message (step S2208). The design support apparatus 100 updates the error list 1700 (step S2209). Update of the error list 1700 indicates deletion of an element, which has been processed, from the error list 1700.

The design support apparatus 100 determines whether or not a next element is present in the error list 1700 (step S2210). If it is determined that a next element is present in the error list 1700 (Yes in step S2210), the design support apparatus 100 proceeds the process to step S2103. If it is determined that a next element is not present in the error list 1700 (No in step S2210), the design support apparatus 100 outputs the layout data (step S2211), and ends the series of processes.

Execution of the processes illustrated in FIGS. 21 and 22 may be automatically started when a density error is detected in DRC, or may be started in response to an instruction from a designer.

The target circuit to be designed serves as a component circuit on an upper level at which the target circuit is used. Therefore, in the present embodiment, a dummy pattern generating process on an upper-level target circuit is not described, but is performed similarly to the dummy pattern generating process on a component circuit. The processes illustrated in FIGS. 21 and 22 may be performed when a density error occurs in DRC performed after generation of dummy patterns for a target circuit. For example, a target circuit may be used as a component circuit, and multiple dummy patterns for different density ratios are generated so that a library is made with the generated patterns. In the case of the block level serves as an upper level and where the standard/macro cell level serves as a lower level, the block level serves as a lower level after completion of block layout design on the block level. Multiple types of dummy pattern for the block are generated so that a library is made with the generated patterns, and sub-chip layout design on the sub-chip level serving as an upper level is performed.

As described above, the design support apparatus 100 changes the dummy pattern of a component circuit in a density error area in the target circuit, into one of the dummy patterns that have different shapes and that are prepared for each component circuit in advance. Thus, the design support apparatus 100 generates layout data satisfying the density constraint. Accordingly, in upper-level layout design, the design support apparatus 100 may adjust the shape of the layout pattern of a lower-level component circuit. Therefore, the design support apparatus 100 may change the shape of a layout pattern, facilitating clearing of a density error. The design support apparatus 100 easily adjusts the density of a target circuit, and may suppress reoccurrence of a layout design operation and the like on a lower-level component circuit. In addition, the design support apparatus 100 may suppress a prolonged design time due to redesign.

The design support apparatus 100 prepares multiple dummy patterns for different density ratios, and changes the dummy pattern of a component circuit in a density error area in the target circuit into a dummy pattern for a different density ratio so that an error is cleared. Thus, in upper-level layout design, the design support apparatus 100 may adjust the density of the layout pattern of a lower-level component circuit. Therefore, the design support apparatus 100 may facilitate clearing of a density error.

In the case of the "high density error" in which the density of an error area is too high, the design support apparatus 100 extracts a dummy pattern for a component circuit which is generated for a lower density than the density for the dummy pattern of the component circuit in the error area. Thus, the design support apparatus 100 may replace the dummy pattern of the component circuit in the error area so that the density of the error area is decreased. Therefore, the design support apparatus 100 may facilitate clearing of a "high density error".

In the case of the "low density error" in which the density of an error area is too low, the design support apparatus 100 extracts the dummy pattern for a component circuit which is generated for a higher density than the density for the dummy pattern of the component circuit in the error area. Thus, the design support apparatus 100 may replace the dummy pattern of the component circuit in the error area so that the density of the error area is increased. Therefore, the design support apparatus 100 may facilitate clearing of a "low density error".

In the case of the "density difference error", the design support apparatus 100 extracts a dummy pattern of a component circuit which is generated for a density different from the density for the dummy pattern of the component circuit in the error area, in accordance with comparison between the density of the error area and the density of an adjacent area.

Thus, the density difference between the error area and the adjacent area may be made small.

The design support method described in the present embodiment may be implemented by executing a design support program which is prepared in advance, by a computer, such as a personal computer or a workstation. The design support program is recorded in a computer-readable recording medium, such as a magnetic disk, an optical disk, or a Universal Serial Bus (USB) flash memory. The design support program is read, for execution, from the recording medium by the computer. The design support program may be distributed over a network such as the Internet.

The design support apparatus 100 described in the present embodiment may be implemented also by using an application specific integrated circuit (hereinafter referred to as an "ASIC" simply), such as a standard cell ASIC or a structured ASIC, or a programmable logic device (PLD) such as a field programmable gate array (FPGA). Specifically, for example, the above-described functions of the controller 1800 may be defined in hardware description language (HDL) description. The HDL description may be subjected to logic synthesis so as to be provided to an ASIC or a PLD. Thus, the design support apparatus 100 may be manufactured.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention

What is claimed is:

1. A design support apparatus comprising:
a memory that stores first layout data and pattern data, the first layout data indicating a circuit pattern of a design target circuit in a given arrangement area, the circuit pattern including circuit patterns of component circuits included in the design target circuit, first dummy patterns of the component circuits, and a wiring pattern to couple between the component circuits, the pattern data indicating, for each of the component circuits, a second dummy pattern of the respective component circuits having a shape different from a shape of the first dummy pattern of the respective component circuits; and
a processor coupled to the memory and configured to:
perform, on each of the component circuits, a density difference error check of whether the density ratio in the area is higher than a density ratio of one area of two adjacent areas to the area by a specific density difference more and whether the density ratio in the area is lower than a density ratio of the other area of the two adjacent areas by the specific density difference more;
generate an error list including information in which a type of error check of the density difference error check and a result of the density difference error check are associated with each other,
specify, from among the component circuits, a first component circuit which is included in the two adjacent areas which do not satisfy a constraint of the density difference error check based on the error list,
extract, from the memory, first pattern data indicating a first dummy pattern for the first component circuit,
extract, from the memory, second pattern data indicating a second dummy pattern for the first component circuit based on the error list,
generate second layout data indicating a circuit pattern by replacing the first pattern data with the second pattern data in the first layout data, and
output the second layout data.

2. The design support apparatus according to claim 1, wherein a plurality of dummy patterns which have a different density from a density for the first dummy pattern of the respective component circuits are stored in the memory as the second dummy data for each of the component circuits, and wherein the processor extracts, from the memory, the second pattern data based on the different density.

3. The design support apparatus according to claim 1, wherein the processor is configured to further perform, on each of the component circuits, a first error check, and wherein the processor extracts, from the memory, the second pattern data indicating, as the second dummy pattern, a dummy pattern for a lower density than the density for the first dummy pattern.

4. The design support apparatus according to claim 1, wherein the processor is configured to further perform, on each of the component circuits, a second error check, and wherein the processor extracts, from the memory, the second pattern data indicating, as the second dummy pattern, a dummy pattern for a higher density than the density for the first dummy pattern.

5. The design support apparatus according to claim 1, wherein the processor extracts, from the memory, the second pattern data indicating, as the second dummy pattern, dummy patterns in which a density difference between a first density between the area and the one area of the two adjacent areas and a second density between the area and the other area of the two adjacent areas are equal to or lower than the specific density difference.

6. A design support method comprising:
performing, by a computer coupled to a memory which stores first layout data and pattern data, the first layout data indicating a circuit pattern of a design target circuit in a given arrangement area, the circuit pattern including circuit patterns of component circuits included in the design target circuit, first dummy patterns of the component circuits, and a wiring pattern to couple between the component circuits, the pattern data indicating, for each of the component circuits, a second dummy pattern of the respective component circuits having a shape different from a shape of the first dummy pattern of the respective component circuits, on each of the component circuits, a density difference error check of whether the density ratio in the area is higher than a density ratio of one area of two adjacent areas to the area by a specific density difference more and whether the density ratio in the area is lower than a density ratio of the other area of the two adjacent areas by the specific density difference more;
generating an error list including information in which a type of error check of the density difference error check and a result of the density difference error check are associated with each other;
specifying, from among the component circuits, a first component circuit which is included in the two adjacent areas which do not satisfy a constraint of the density difference error check based on the error list;

extracting, from the memory, first pattern data indicating a first dummy pattern for the first specified component circuit;

extracting, from the memory, second pattern data indicating a second dummy pattern for the first component circuit based on the error list;

generating second layout data indicating a circuit pattern by replacing the first pattern data with the second pattern data in the first layout data; and outputting the second layout data.

7. A non-transitory computer-readable recording medium that stores therein a computer program for design support, the computer program enabling a computer coupled to a memory to execute a process, the process comprising:

performing, on each of component circuits in the memory which stores which stores first layout data and pattern data, the first layout data indicating a circuit pattern of a design target circuit in a given arrangement area, the circuit pattern including circuit patterns of the component circuits included in the design target circuit, first dummy patterns of the component circuits, and a wiring pattern to couple between the component circuits, the pattern data indicating, for each of the component circuits, a second dummy pattern of the respective component circuits having a shape different from a shape of the first dummy pattern of the respective component circuits, a density difference error check of whether the density ratio in the area is higher than a density ratio of one area of two adjacent areas to the area by a specific density difference more and whether the density ratio in the area is lower than a density ratio of the other area of the two adjacent areas by the specific density difference more;

generating an error list including information in which a type of error check of the density difference error check and a result of the density difference error check are associated with each other;

specifying, from among the component circuits, a first component circuit which is included in the two adjacent areas which do not satisfy a constraint of the density difference error check based on the error list;

extracting, from the memory, first pattern data indicating a first dummy pattern for the first component circuit;

extracting, from the memory, second pattern data indicating a second dummy pattern for the first component circuit based on the error list;

generating second layout data indicating a circuit pattern obtained by replacing the first pattern data with the second pattern data in the first layout data; and outputting the second layout data.

* * * * *